(12) United States Patent
Chen et al.

(10) Patent No.: US 11,855,024 B2
(45) Date of Patent: Dec. 26, 2023

(54) WAFER CHIP SCALE PACKAGES WITH VISIBLE SOLDER FILLETS

(71) Applicant: TEXAS INSTRUMENTS INCORPORATED, Dallas, TX (US)

(72) Inventors: Qiao Chen, Flower Mound, TX (US); Vivek Swaminathan Sridharan, Dallas, TX (US); Christopher Daniel Manack, Flower Mound, TX (US); Patrick Francis Thompson, Allen, TX (US); Jonathan Andrew Montoya, Dallas, TX (US); Salvatore Frank Pavone, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 101 days.

(21) Appl. No.: 17/463,047

(22) Filed: Aug. 31, 2021

(65) Prior Publication Data

US 2023/0065075 A1 Mar. 2, 2023

(51) Int. Cl.
*H01L 23/00* (2006.01)

(52) U.S. Cl.
CPC .............. *H01L 24/09* (2013.01); *H01L 24/25* (2013.01); *H01L 24/73* (2013.01); *H01L 24/81* (2013.01); *H01L 2224/09181* (2013.01); *H01L 2224/2541* (2013.01); *H01L 2224/73209* (2013.01); *H01L 2224/81801* (2013.01)

(58) Field of Classification Search
CPC ......... H01L 24/09; H01L 24/25; H01L 24/81; H01L 2224/2541; H01L 2224/73209; H01L 2224/81801
USPC .......................................... 257/737; 438/613
See application file for complete search history.

(56) References Cited

U.S. PATENT DOCUMENTS

| | | | |
|---|---|---|---|
| 2010/0117231 A1* | 5/2010 | Lang | H01L 23/3114 257/E23.07 |
| 2014/0264846 A1* | 9/2014 | Chen | H01L 25/0652 257/737 |
| 2017/0200664 A1* | 7/2017 | Tsao | H01L 24/13 |

* cited by examiner

*Primary Examiner* — Didarul A Mazumder
(74) *Attorney, Agent, or Firm* — Dawn Jos; Frank D. Cimino

(57) ABSTRACT

In some examples a wafer chip scale package (WCSP) includes a semiconductor die having a device side in which a circuit is formed, and a redistribution layer (RDL) coupled to the device side that is positioned within an insulating member. In addition, the WCSP includes a scribe seal circumscribing the circuit along the device side, wherein the RDL abuts the scribe seal. Further, the WCSP includes a conductive member coupled to the RDL. The conductive member is configured to receive a solder member, and the insulating member does not extend along the device side of the semiconductor die between the conductive member and a portion of an outer perimeter of the WCSP closest to the conductive member.

22 Claims, 25 Drawing Sheets

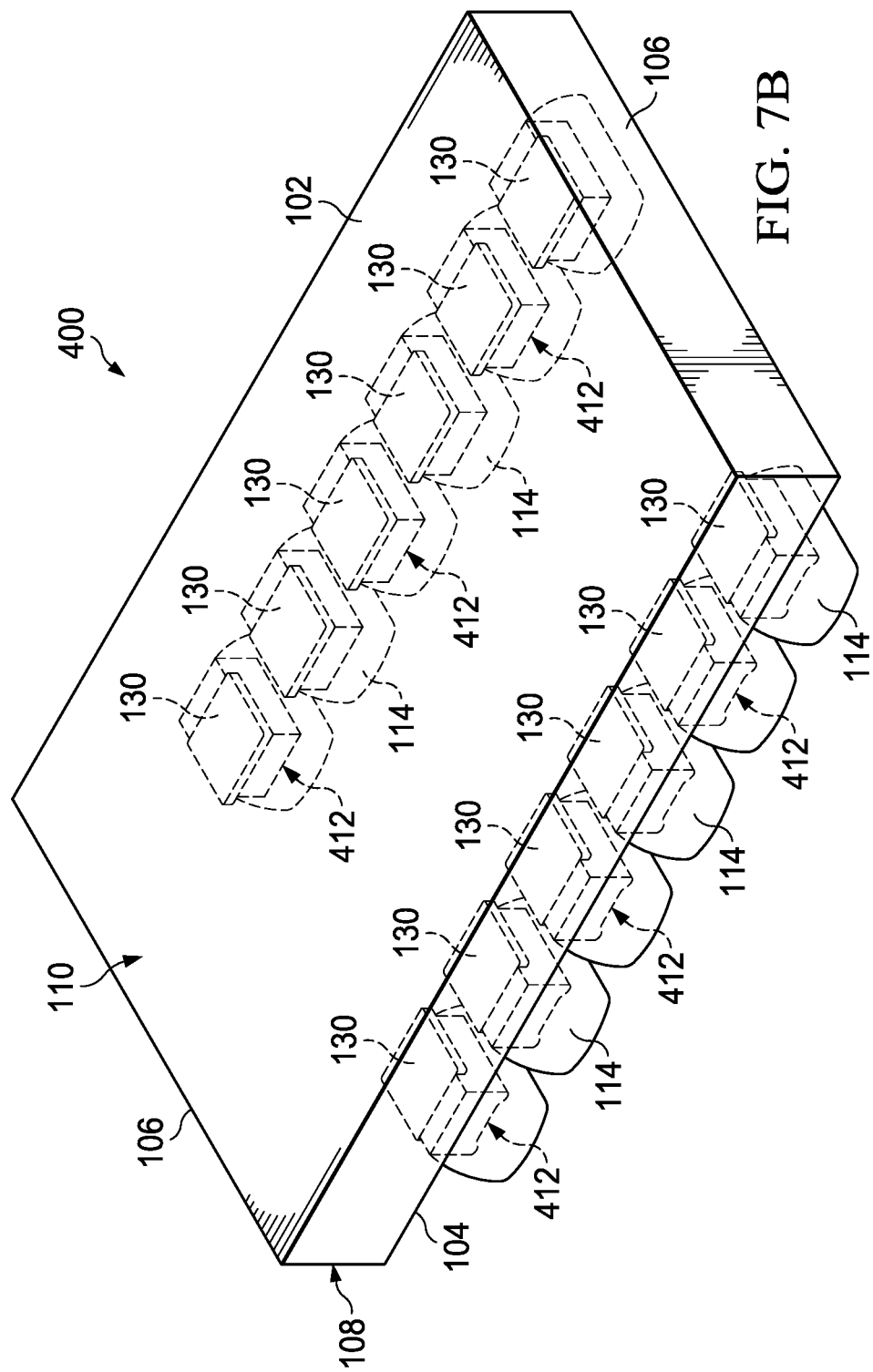

WAFER CHIP SCALE PACKAGES WITH VISIBLE SOLDER FILLETS

BACKGROUND

During semiconductor chip manufacturing, circuits may be formed on a wafer of semiconductor material (e.g., silicon). The wafer may then be singulated into a plurality of semiconductor dies. Each die is then processed to form a semiconductor package that may be integrated with an electronic device (e.g., computers, smartphones). In some circumstances, wafer-level packaging (WLP) techniques may be used to form semiconductor dies and packages on the wafer prior to singulation. A semiconductor package manufactured using such WLP techniques may be referred to as a wafer chip scale package (WCSP).

SUMMARY

In accordance with at least one example of the disclosure, a WCSP comprises a semiconductor die having a device side in which a circuit is formed and a redistribution layer (RDL) coupled to the device side that is positioned within an insulating member. In addition, the WCSP comprises a scribe seal circumscribing the circuit along the device side, wherein the RDL abuts the scribe seal. Further, the WCSP comprises a conductive member coupled to the RDL. The conductive member is configured to receive a solder member, and the insulating member does not extend along the device side of the semiconductor die between the conductive member and a portion of an outer perimeter of the WCSP closest to the conductive member.

In accordance with at least one example of the disclosure a WCSP comprises a semiconductor die having a device side in which a circuit is formed and a redistribution layer (RDL) coupled to the device side. In addition, the WCSP comprises a conductive member coupled to the RDL and to the device side of the semiconductor die, a segment of the device side between the conductive member and a portion of an outer perimeter of the WCSP closest to the conductive member being independent of a polyimide (PI) layer. When the WCSP is coupled to a printed circuit board (PCB), the conductive member is configured to form a solder fillet that extends from the conductive member beyond the outer perimeter of the WCSP. The conductive member comprises a central axis, an inner end engaged with the RDL, and a first recess extending axially into the inner end with respect to the central axis.

In accordance with at least one example of the disclosure a WCSP comprises a semiconductor die having a device side comprising a scribe seal and a redistribution layer (RDL) coupled to the device side. In addition, the WCSP comprises a conductive member coupled to the RDL, wherein the conductive member is configured to receive a solder member. A first side surface of the conductive member extends beyond the RDL to align with the scribe seal, and a portion of the device side between the conductive member and a portion of an outer perimeter of the WCSP closest to the conductive member is independent of a polyimide (PI) layer.

In accordance with at least one example of the disclosure a method for manufacturing a WCSP comprises forming a redistribution layer (RDL) on a device side of a semiconductor die, forming an insulating member on the device side, and forming a plurality of conductive members on the RDL. Each of the plurality of conductive members comprises a central axis, an inner end engaged with the RDL, an outer end spaced from the inner end along the central axis, and a plurality of side surfaces extending between the inner end and the outer end. A first side surface of the plurality of side surfaces is positioned less than 30 micrometers (μm) from an outer perimeter of the WCSP, and a portion of the device side between the first side surface and the outer perimeter of the WCSP does not include the insulating member.

BRIEF DESCRIPTION OF THE DRAWINGS

For a detailed description of various examples, reference will now be made to the accompanying drawings in which:

FIG. 7B is a perspective view of the WCSP shown in FIG. 7A without the PCB according to some examples.

DETAILED DESCRIPTION

A plurality of WCSPs may be formed on a wafer prior to singulation of the wafer to produce individual WCSPs. Because many of the manufacturing steps to produce a WCSP are performed on the wafer, the manufacturing of WCSPs may be more streamlined and efficient when compared to the manufacturing process for other types of semiconductor chips that are not manufactured using WLP techniques. As a result, WCSPs may carry substantial economic benefits.

WCSPs may have conductive members that may be soldered to a PCB (or other suitable component) of an electronic device. In some cases, it is desirable for solder material to form a fillet extending beyond the outer perimeter of a semiconductor chip package so that the quality of the soldered connection may be visually verified from above (e.g., manually or via automatic visual inspection (AVI) techniques). However, manufacturing tolerances and design considerations have, thus far, prevented WCSPs from achieving a visible solder fillet that extends beyond the outer perimeter of the package for visual inspection purposes. Consequently, while WCSPs are formed in bulk and thus carry significant manufacturing efficiencies, they are currently not utilized in electronic devices that are subjected to post-assembly visual solder inspections (e.g., AVI) as a part of quality verification processes.

Accordingly, examples disclosed herein include WCSPs having conductive members positioned within a sufficient proximity to the side surfaces of the WCSP to form a visible (e.g., in a top view from above) solder members (or solder fillets) when connected to a PCB (or other suitable component). As a result, the WCSPs of the examples disclosed herein may be subjected to visual solder connection inspection techniques, such as manual inspection or AVI. However, the WCSPs of the examples disclosed herein may still be manufactured using WLP techniques as described above. Thus, through use of the WCSPs of the examples disclosed herein, WCSPs may be utilized in a wider variety of electronic devices, so that the economic benefits of these semiconductor packages may be more broadly realized.

Figure 1:
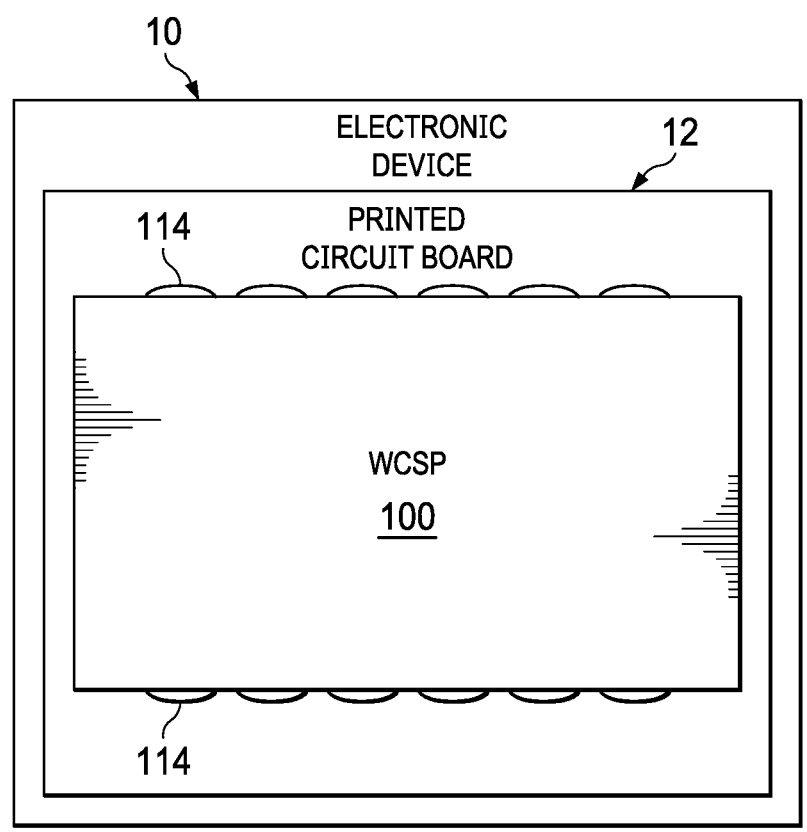
FIG. 1 is a block diagram of an electronic device including a WCSP having solder fillets visible in a top view according to some examples.

Referring now to FIG. 1, a block diagram of an electronic device 10 including a WCSP 100 having solder members 114 that form fillets visible in a top view according to some examples is shown. In particular, the electronic device 10 may be a laptop computer, a notebook computer, a desktop computer, a smartphone, an appliance (e.g., a refrigerator, a laundry machine, an oven, a toaster), a television, an automobile or a component within an automobile, an aircraft or a component within an aircraft, a water vehicle or a component within a water vehicle, or any other type of device containing one or more electronic components.

In some examples, the electronic device 10 includes a PCB 12. The WCSP 100 is coupled to the PCB 12. During use of the electronic device 10, the WCSP 100 may receive power and/or data signals and may perform a function or functions that contribute to the overall use and functionality of the electronic device 10. Other components (e.g., such as other semiconductor packages and/or other electronic devices) may be coupled to PCB 12 and potentially coupled to the WCSP 100. However, these possible additional components are not shown in FIG. 1 so as to simplify the drawing.

Figure 2:
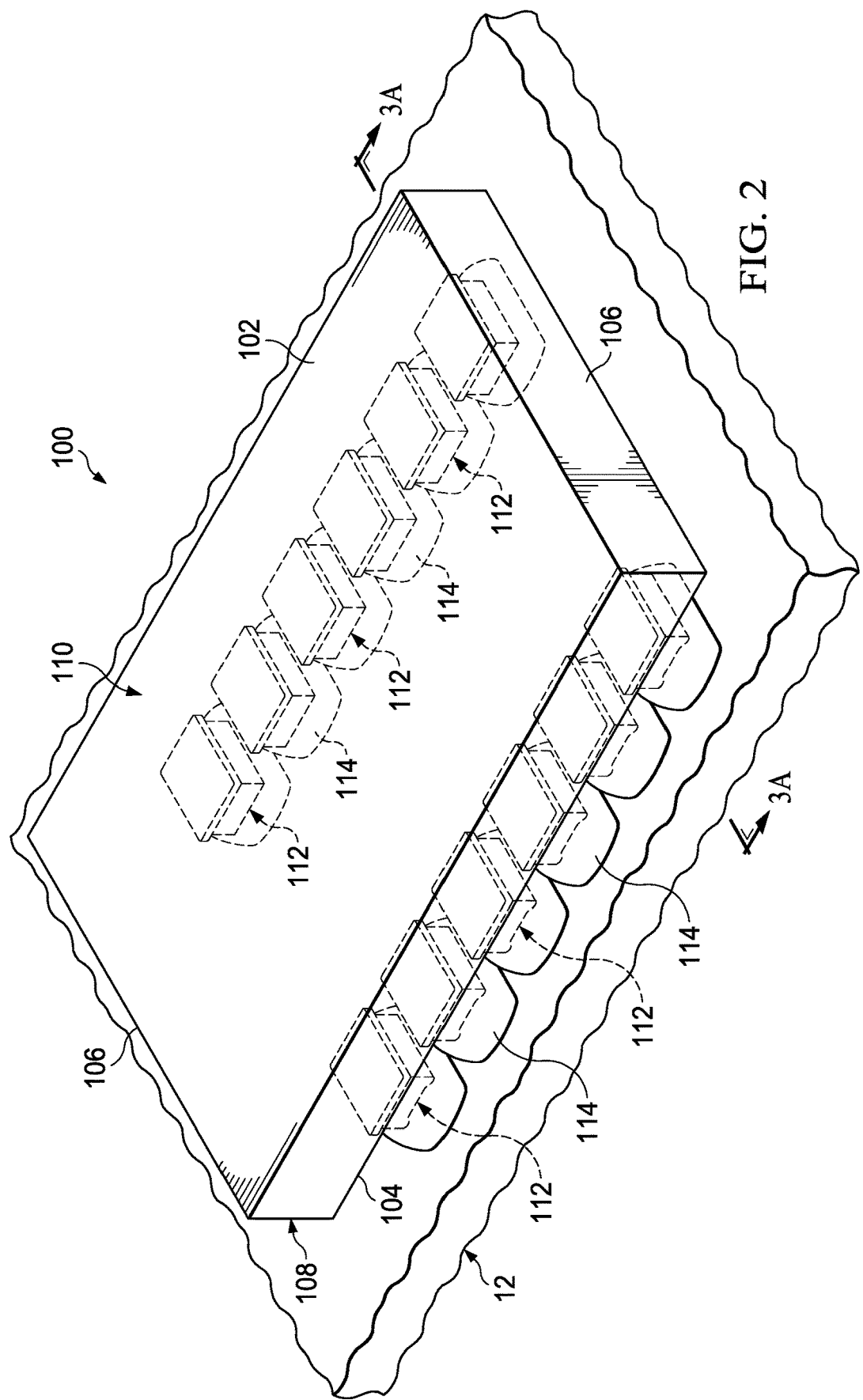
FIG. 2 is a perspective view of a printed circuit board (PCB) and WCSP of the electronic device of FIG. 1 according to some examples.

Referring now to FIG. 2, a perspective view of the PCB 12 and the WCSP 100 of the electronic device 10 of FIG. 1 is shown according to some examples. The WCSP 100 comprises a semiconductor die 110 having a first or non-device side 102 and a second or device side 104 opposite non-device side 102. A plurality of side surfaces 106 extend between the non-device side 102 and the device side 104. In some examples, the non-device side 102 and device side 104 may comprise parallel (or substantially parallel) planar surfaces and the side surfaces 106 extend orthogonally (or substantially orthogonally) to the non-device side 102, and device side 104. The semiconductor die 110 may be generally square or rectangular in shape (when viewed in a normal direction to either non-device side 102 or device side 104), such that semiconductor die 110 may comprise four side surfaces 106. Thus, in some examples, the semiconductor die 110 may be shaped as a rectangular parallelepiped (although other shapes are contemplated in other examples). Together, the side surfaces 106 may form an outer perimeter 108 of WCSP 100 when WCSP 100 is viewed in a normal direction to either non-device side 102 or device side 104 of semiconductor die 110. The semiconductor die 110 may comprise a semiconductor material (e.g., silicon).

A plurality of conductive members 112 may be formed along device side 104 that are coupled to PCB 12 (or conductive pads or traces thereof) with metallic solder members 114. As will be described in more detail below, the solder members 114 may form fillets that extend beyond the outer perimeter 108 of WCSP 100 (which is formed by side surfaces 106 of semiconductor die 110 as previously described). As a result, the solder members 114 are visible when WCSP 100 is viewed from above (e.g., in a direction that is normal to the non-device side 102). Each solder member 114 covers (or substantially covers) a corresponding one of the conductive members 112, so that conductive members 112 are shown with broken lines in FIG. 2.

Figure 3A:
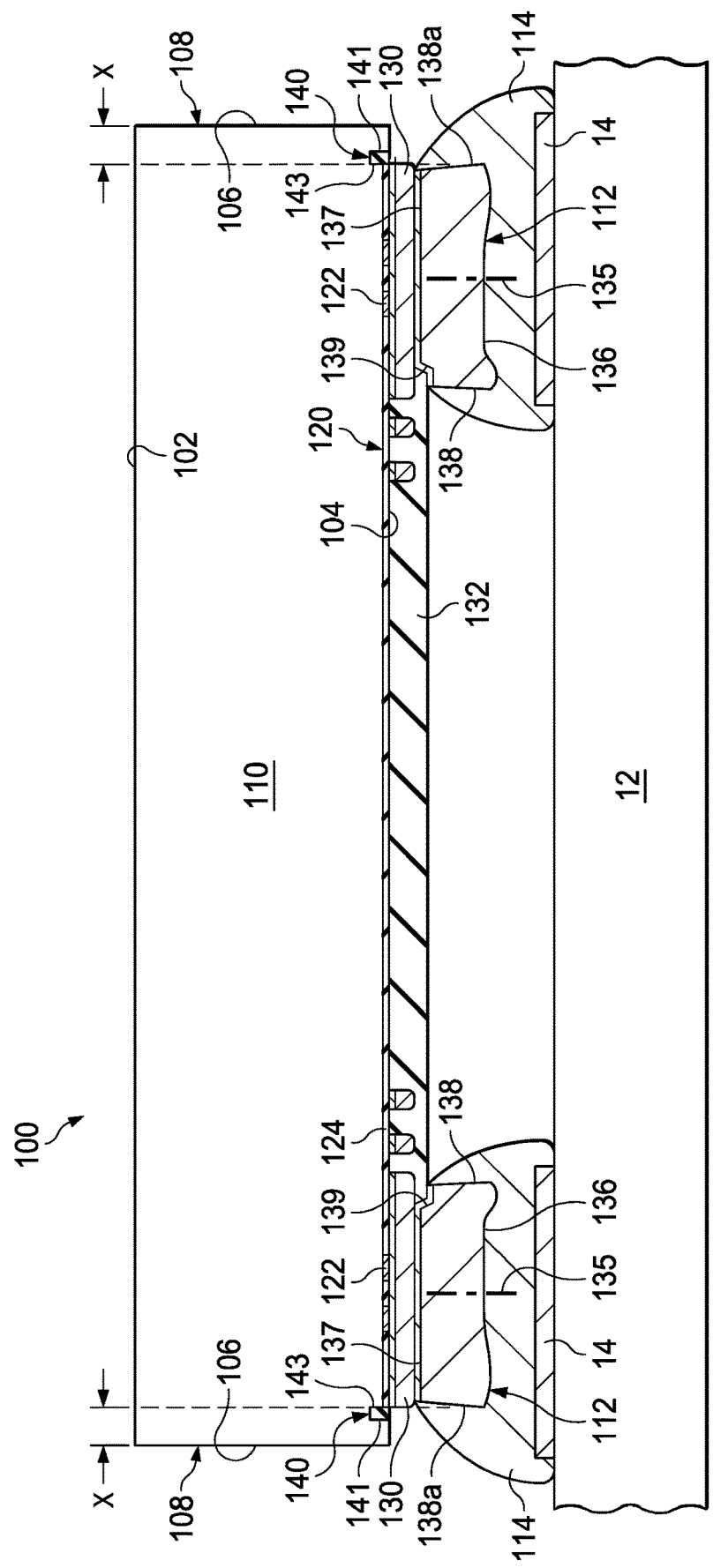
FIG. 3A is a cross-sectional view of a WCSP for use within the electronic device of FIG. 1 according to some examples.
Figure 3B:
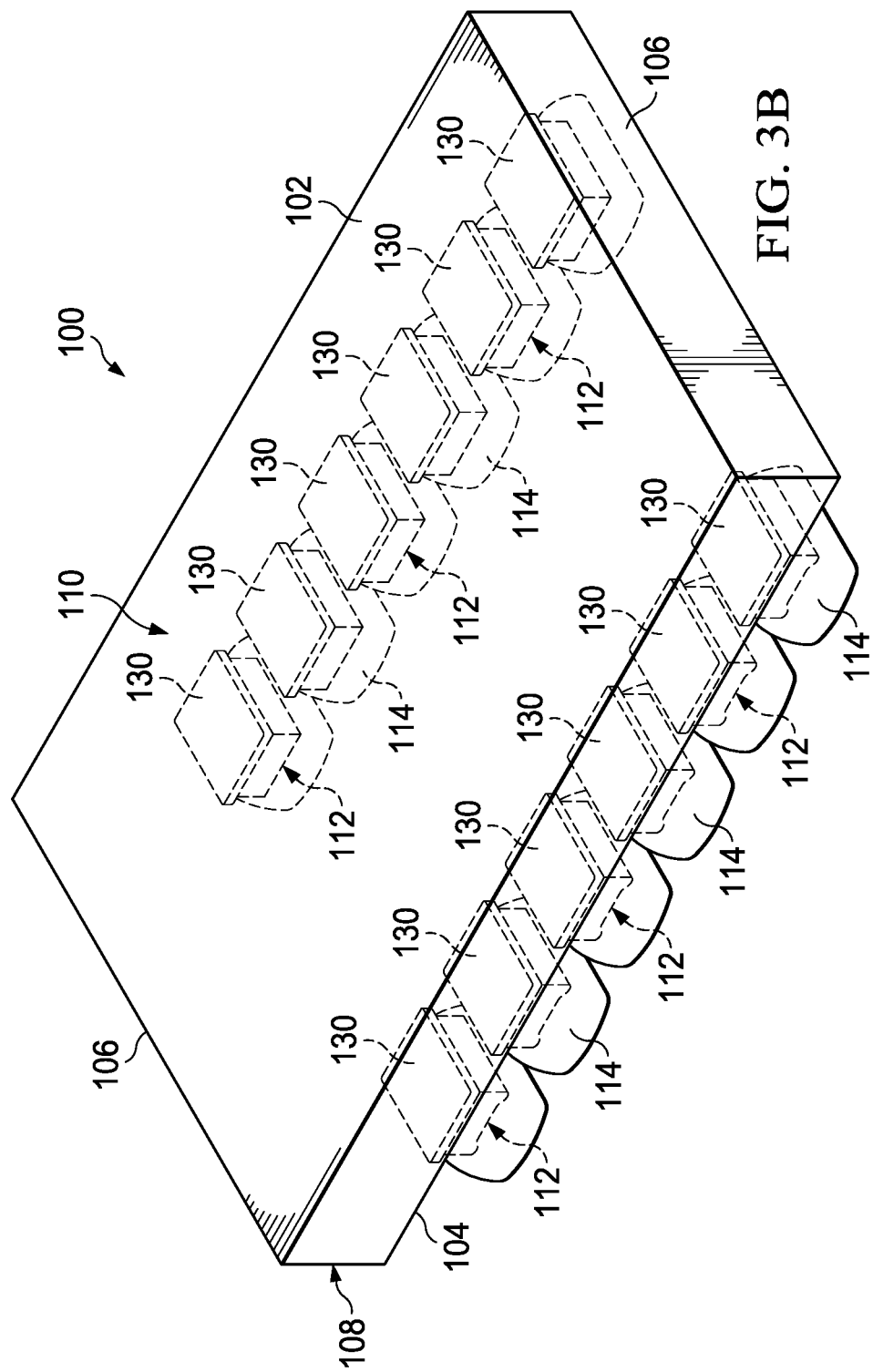
FIG. 3B is a perspective view of the WCSP shown in FIG. 3A without the PCB according to some examples.
Figure 3C:
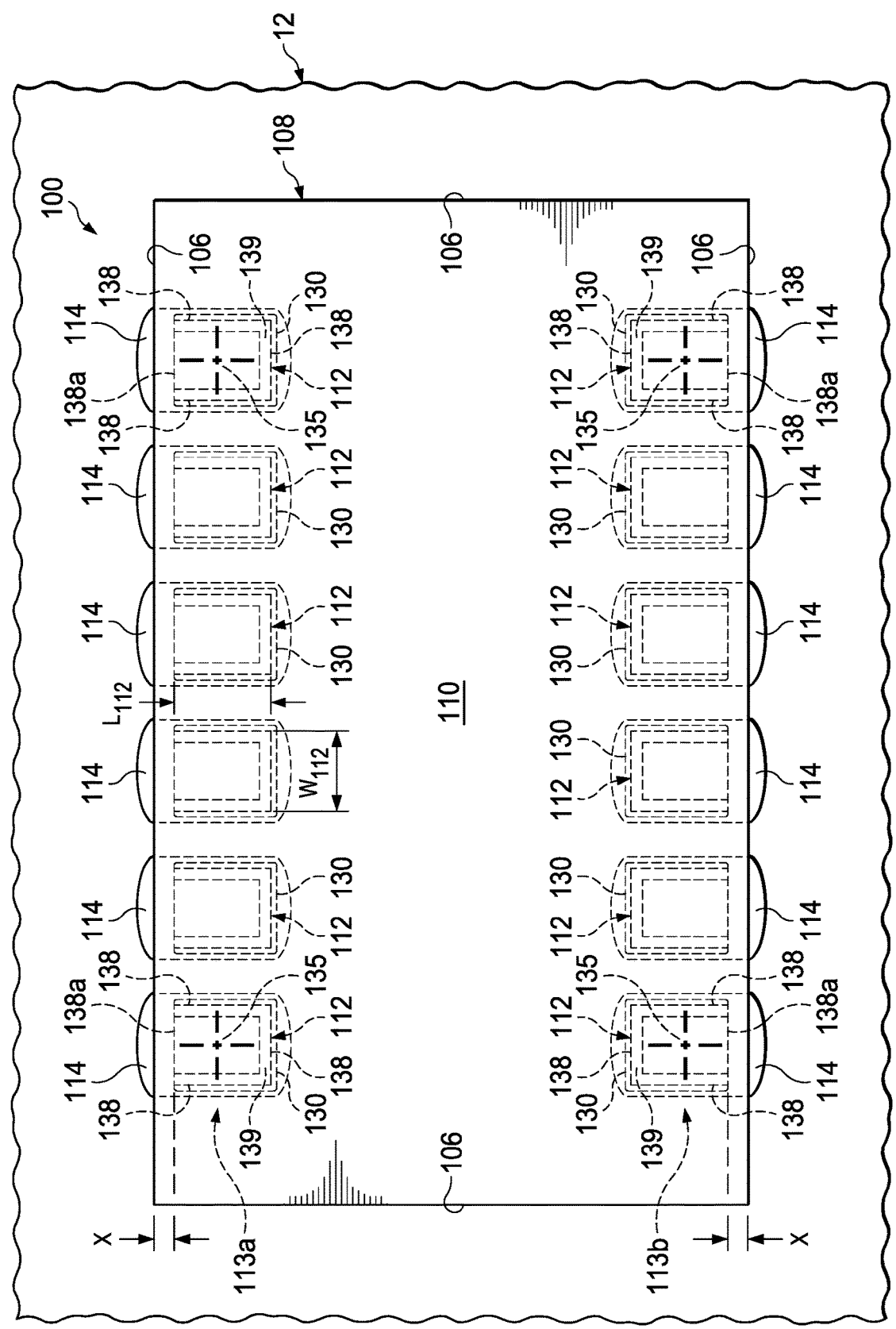
FIG. 3C is a top view of the WCSP and PCB shown in FIG. 3A according to some examples.

FIG. 3A shows a cross-sectional view along section 3A-3A in FIG. 2 of WCSP 100 according to some examples. In addition, FIG. 3B shows a perspective view of WCSP 100 without PCB 12 according to some examples, and FIG. 3C shows a top-down view of the WCSP 100 and PCB 12 of FIG. 2 according to some examples.

Referring now to FIG. 3A, active circuitry 120 is formed along device side 104 of semiconductor die 110. Active circuitry 120 may be more simply referred to herein as a "circuit" 120. A plurality of conductive members 122 are coupled to circuit 120, and are exposed through an insulating member 124 that otherwise covers circuit 120. The conductive members 122 define the input and/or output terminals for circuit 120.

A scribe seal 140 circumscribes the circuit 120 along device side 104. The scribe seal 140 is configured to prevent cracks formed in the semiconductor die 110 during the singulation process from propagating through the semiconductor die 110, under or through the circuit 120. Scribe seal 140 may comprise a plurality of stacked layers (e.g., metallic layers) that are embedded within the semiconductor die 110 and exposed along device side 104. The layers of the scribe seal 140 may be electrically grounded within the semiconductor die 110. As shown in FIG. 3A, the scribe seal 140 may be positioned between the circuit 120 and the side surfaces 106 of semiconductor die 110. Specifically, scribe seal 140 comprises a first or outer side 141 that faces the side surfaces 106 of semiconductor die 110, and a second or inner side 143 that faces the circuit 120.

A redistribution layer (RDL) 130 is positioned over the insulating member 124, circuit 120 and conductive members 122. In particular, RDL 130 comprises one or more conductive members (e.g., comprising an electrically conductive material such as Copper (Cu)) that are coupled to the conductive members 122. Accordingly, during operations, RDL 130 is configured to route electric current to and from circuit 120 via conductive members 122. The RDL 130 may be positioned within an electrically insulating member 132 (or more simply "insulating member 132"). The insulating member 132 may comprise polyimide (PI). As shown in FIG. 3A, in some examples the RDL 130 extends to directly abut the scribe seal 140. Specifically, the RDL 130 may extend outward to abut and/or align with the inner side 143 of scribe seal 140. As used herein, the term "abut" means directly touching. Thus, the RDL 130 may directly touch the scribe seal 140 in some examples.

The plurality of conductive members 112 are coupled to the RDL 130. The conductive members 112 may be configured to form the solder fillets of solder members 114. The conductive members 112 may each include a central axis 135, an inner end 137, and an outer end 136 axially spaced from inner end 137 along axis 135. The inner end 137 may engage with RDL 130 so that the outer end 136 may project outward from RDL 130 along axis 135. In some examples, the axis 135 may extend normally away from device side 104 and RDL 130.

In some examples, as shown in FIG. 3C, each conductive member 112 may comprise a length $L_{112}$ that extends along or parallel to section 3A-3A (FIG. 2) and a width $W_{112}$ that is perpendicular to length $L_{112}$. In some examples, the length $L_{112}$ and the width $W_{112}$ may range from 90 micrometers (μm) to 500 μm, and in some examples, the length $L_{112}$ may be greater than the width $W_{112}$. If the length $L_{112}$ and/or width $W_{112}$ were less than 90 μm, the cross-sectional area of conductive member 112 that is to contact RDL 130 may be too small to conduct sufficient electrical current to and from RDL 130 (and thus also circuit 120), and to dissipate a sufficient amount of heat during operations. Conversely, if the length $L_{112}$ and/or the width $W_{112}$ were greater than 500 μm, the conductive members 112 would occupy too great an area of the circuit 120 to allow proper electrical signal routing without increasing the circuit size and cost.

Conductive members 112 may each include a plurality of side surfaces 138 extending from inner end 137 to outer end 136. In some examples, the side surface 138 (or some thereof) may extend axially between ends 137, 136 with respect to axis 135. In some examples, the side surfaces 138 may extend between ends 137, 136 at a non-zero angle relative to axis 135 such that side surfaces 138 flare (or diverge) radially outward moving along axis 135 from inner end 137 to outer end 136. This flaring of the side surfaces 138 may result from the manufacturing process for WCSP 100 (examples of which are described in more detail herein). FIG. 3B is a perspective view of the structure of FIG. 3A without the PCB 12, as explained above.

Referring briefly now to FIG. 3C, the conductive members 112 may be arranged along one or more of the side surfaces 106 forming outer perimeter 108 of WCSP 100. In some examples, additional conductive members (not shown) (e.g., ground connectors) may be positioned along device side 104 that are spaced inward from side surfaces 106 and conductive members 112. In the depiction of FIG. 3C, the conductive members 112 are arranged in two rows 113a, 113b that are each arranged along opposing side surfaces 106 of semiconductor die 110. Thus, each conductive member 112 may comprise one side surface 138a that is positioned closest to (e.g., along) the outer perimeter 108 of WCSP 100. This side surface 138a is designated as "138a" herein, and may be referred to as the "edge-facing" side surface 138a for each conductive member 112 for clarity. As best shown in FIG. 3A, for each conductive member 112, the edge-facing side surface 138a may be more proximate the inner side 143 of scribe seal 140 than the other side surfaces 138.

Referring again to FIG. 3A, a solder member 114 connects each conductive member 112 to a conductive pad, terminal, or trace (generally referred to herein as a "trace") 14 positioned on the PCB 12. The solder member 114 may form a fillet that extends along each of the side surfaces 138 (including the edge-facing side surface 138a), as well as the outer end 136 so as to ensure a strong electrical and mechanical connection between the conductive member 112 and the corresponding trace 14.

Referring now to FIGS. 3A and 3C, a recess 139 may extend radially inward toward axis 135 along some of the side surfaces 138 of each conductive member 112. In particular, for each conductive member 112, the recess 139 may extend inward from all of the side surfaces 138 except for edge-facing side surface 138a. As shown in FIG. 3A, the insulating member 132 may extend within recess 139 such that the insulating member 132 may fill (or substantially fill) the recess 139. Without being limited to this or any other theory, the positioning of insulating member 132 within recess 139 may help to dissipate stresses transferred between conductive member 112 and RDL 130 during operations.

The recess 139 extends from 5 μm to 25 μm into the side surfaces 138 of conductive member 112. A recess 139 that extends less than 5 μm into the side surfaces 138 may be within manufacturing tolerances so that the recess 139 may not be consistently formed. Conversely, a recess 139 that extends more than 25 μm into the side surfaces 138 of conductive member 112 would sufficiently reduce the contact surface area of conductive member 112 and RDL 130 to provide insufficient electrical connectivity therebetween.

Because the recess 139 may not extend along the edge-facing side surfaces 138a of conductive members 112 as previously described, the insulating member 132 may not be positioned along edge-facing side surfaces 138a. Thus, for each conductive member 112, the insulating member 132 does not extend along the device side 104 of the die 110 between the conductive member 112 (e.g., along edge-facing side surfaces 138a) and the portion of the outer perimeter 108 closest to the conductive members 312 (such that this segment of the device side 104 is independent of the insulating member 132). If insulating member 132 were to be placed along edge-facing side surfaces 138a, then the edge-facing side surfaces 138a would be spaced radially (e.g., with respect to the corresponding axis 135) from the outer edge of RDL 130 a sufficient amount to prevent peeling of the insulating member 132 in this region. However, because no insulating member 132 is positioned along the edge-facing side surfaces 138a, these side surfaces 138a may be extended radially outward (with respect to the corresponding axis 135) toward the outer edge of RDL 130 and scribe seal 140.

The scribe seal 140 may be spaced from the corresponding side surface 106. In particular, because multiple semiconductor dies 110 are manufactured on a semiconductor wafer (not shown) adjacent semiconductor dies 110 may be spaced from one another along the semiconductor wafer to form "scribe streets" for a cutting device (e.g., mechanical saw, laser cutter) to separate the semiconductor wafer into the semiconductor dies 110 during a subsequent singulation process. This spacing between adjacent WCSPs 100 on the semiconductor wafer ultimately results in the space between scribe seal 140 and the side surfaces 106. Depending on the type of cutting device used for the singulation process, the scribe seal 140 (specifically the outer side 141 of scribe seal 140) may be spaced 25 μm or less from the corresponding side surface 106.

As previously described, the RDL 130 may extend outward to abut and/or align with the inner side 143 of scribe seal 140, and the edge-facing side surface 138a of conductive member 112 may be extended outward toward the outer edge of RDL 130 (e.g., due to the absence of recess 139 and insulating member 132 along edge-facing side surface 138a as previously described). Accordingly, in some examples, conductive members 112 may be spaced from the side surface 106 of semiconductor die 110 by a distance X that extends from the outer perimeter 108 (which is defined by side surface 106 as previously described) to the edge-facing side surface 138a. In some examples, the distance X is sized such that the fillet formed by each solder member 114 may extend outward (e.g., radially outward with respect to the corresponding axis 135) from the edge-facing side surface 138a of the corresponding conductive member 112 past the side surface 106 of the semiconductor die 110 (and thus the outer perimeter 108 of WCSP 100). As a result, the solder member 114 may be visible when semiconductor die 110 is viewed from above (e.g., in a direction normal to the non-device side 102), such that the solder members 114 may be inspected using visual techniques as previously described above (e.g., AVI, manual).

In some examples, to facilitate the visibility of the solder members 114 beyond the side surfaces 106 of semiconductor die 110, the distance X is less than or equal to 30 micrometers (μall) and is at least 10 μm. Stated differently, the edge-facing side surfaces 138a of conductive members 112 are positioned less than or equal to 30 μm and at least 10 μm from the outer perimeter 108. If the distance X was less than 10 μm (e.g., such that the edge-facing side surface 138a is positioned less than 10 μm from outer perimeter 108), then the scribe seal 140, RDL 130, conductive member 112 will be contacted by the cutting device (e.g., a mechanical saw, a laser) during the singulation process for separating the semiconductor die 110 from a larger wafer as generally described above. Conversely, if the distance X was greater than 30 μm (e.g., such that the edge-facing side surface 138a is positioned greater than 30 μm), then the solder member 114 would not extend beyond the side surface 106 to allow for visual inspection thereof as previously described. Specifically, as shown in FIG. 3C, the solder member 114 extends outward (e.g., radially outward with respect to central axis 135) from conductive member 112 to form a solder fillet. However, because the solder member 114 is adhered to the conductive member 112, the radial span or extent (with respect to central axis 135) of the solder fillet formed by the solder member 114 is limited by the position of side surfaces 138 of conductive member 112 (including edge-facing side surface 138a). Thus, a spacing X of greater that 30 μm is sufficiently large relative to the radial span or extent of the solder fillet formed by solder member 114 such that solder member 114 would not extend beyond side surface 106 (and thus outer perimeter 108), or at least would not extend sufficiently beyond side surface 106 such that the solder member 114 is consistently visible when the semiconductor die 110 is viewed from above (e.g., in a direction normal to the non-device side 102).

In some examples, solder member 114 extends outward (e.g., in a radial direction with respect to axis 135) 25 μm to 200 μm from the corresponding side surface 106. If the solder member 114 extended less than 25 μm outward from the side surface 106, a visual inspection system (e.g., an AVI) would not be able to detect the solder member 114. Conversely, a solder member 114 that extends outward more than 200 μm from the corresponding side surface 106 would take up too much space on PCB 12 and would increase the risk electrical shorts and solder overflow due to the increased volume of solder.

Figure 4A:
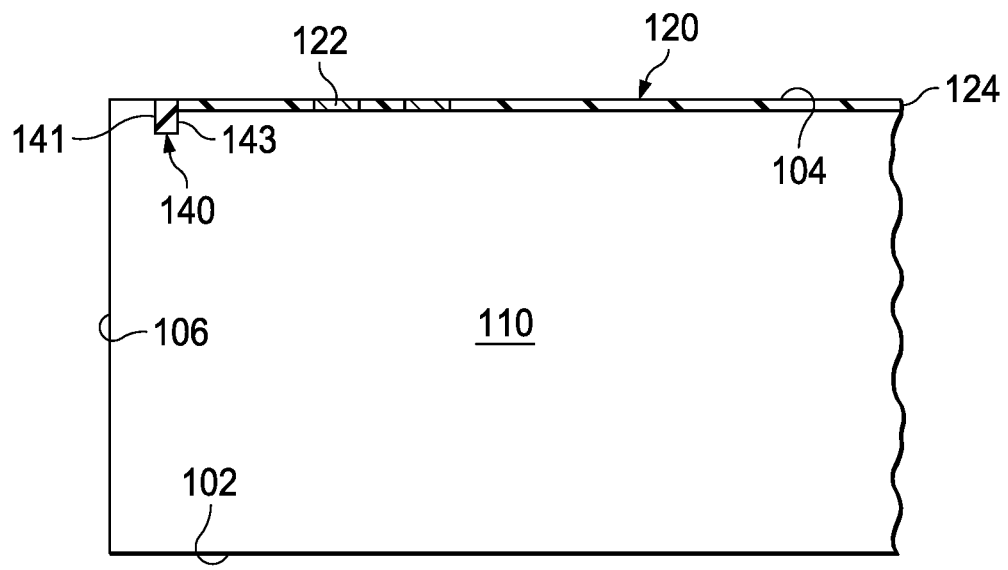
FIGS. 4A-4O are sequential cross-sectional views of a process flow for manufacturing the WCSP shown in FIG. 3A according to some examples.
Figure 4B:
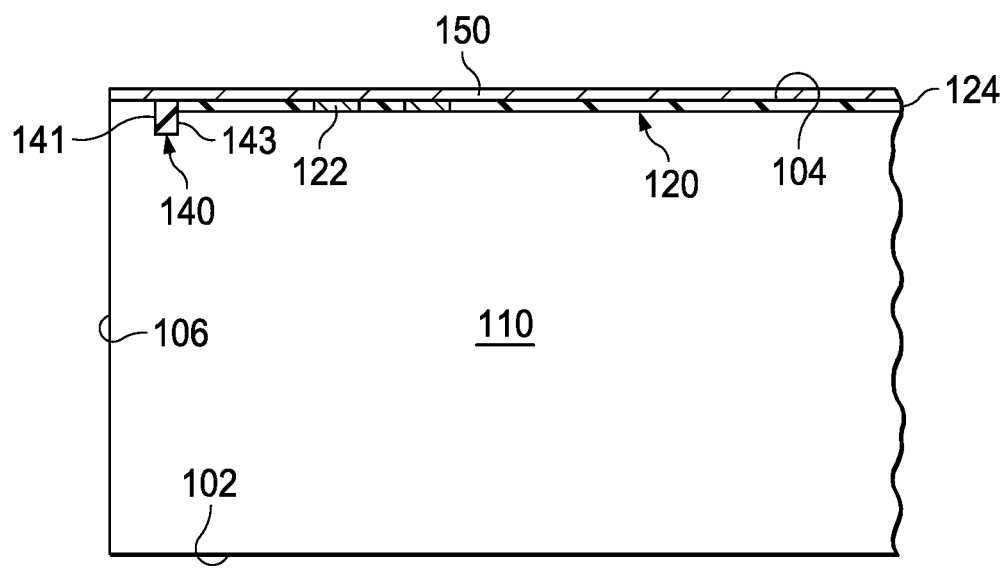
Figure 4C:
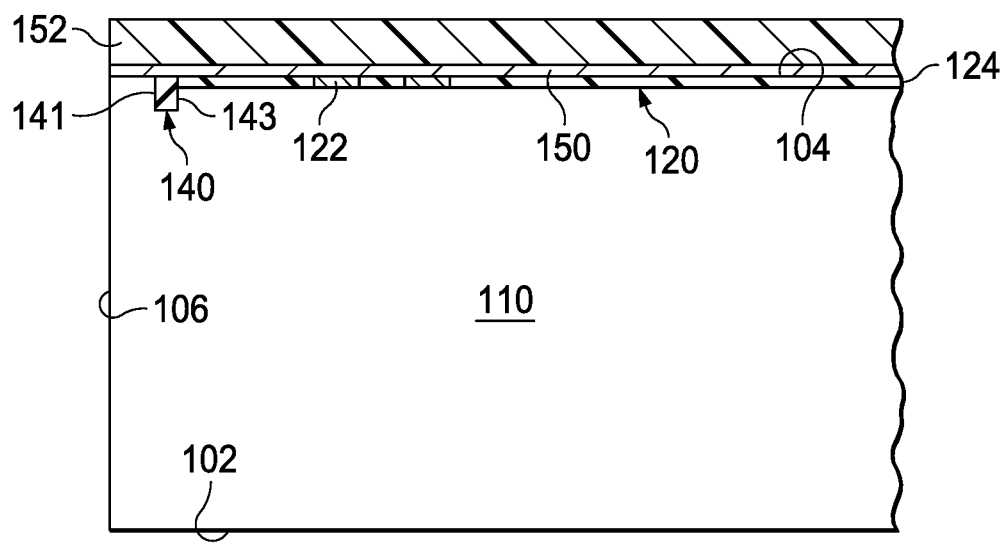
Figure 4D:
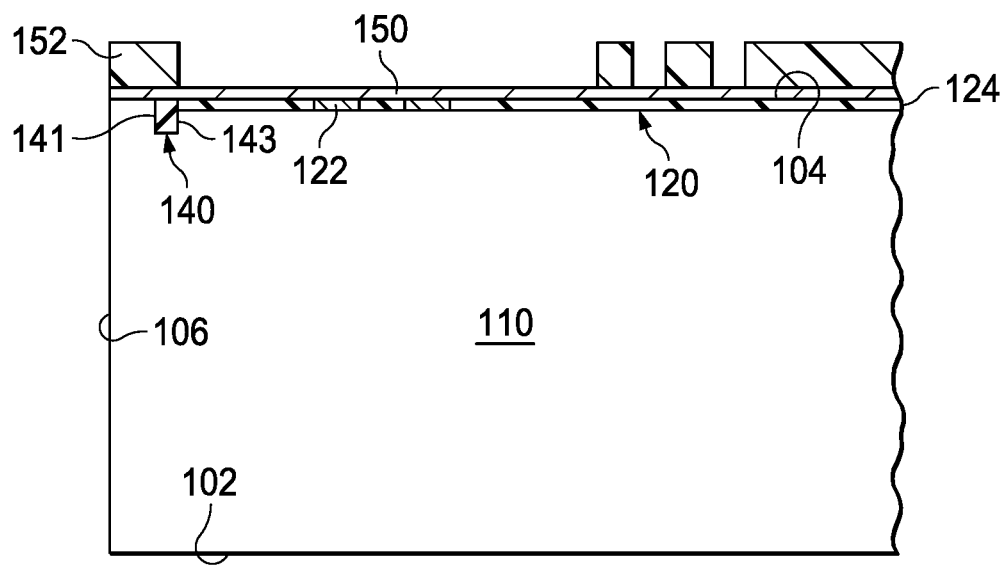
Figure 4E:
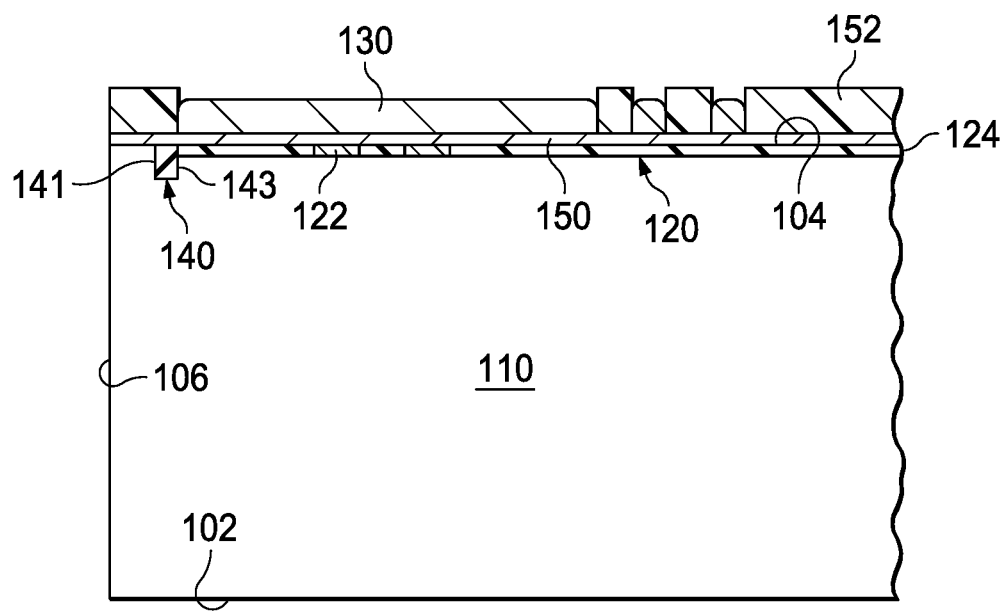
Figure 4F:
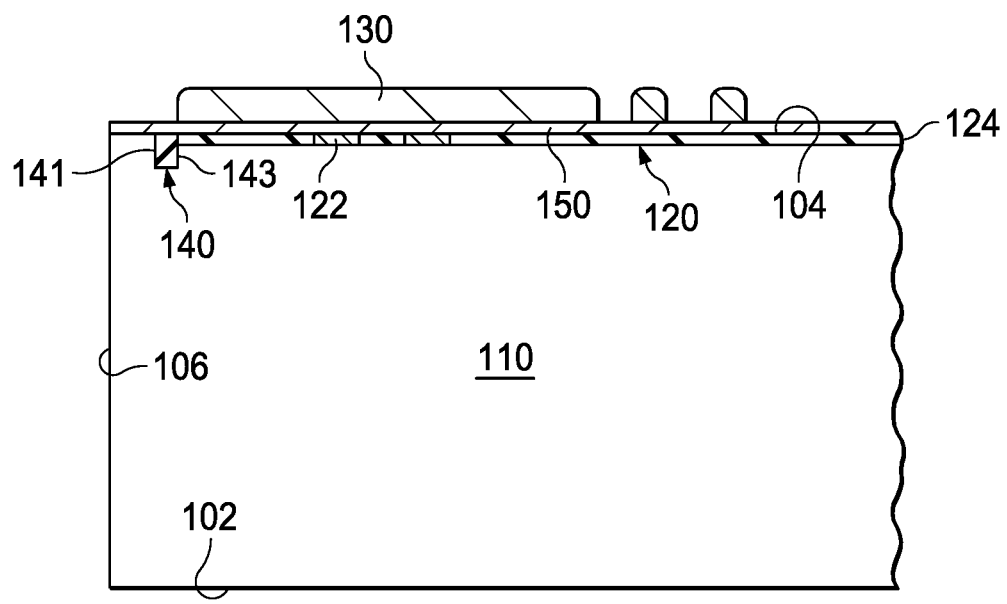
Figure 4G:
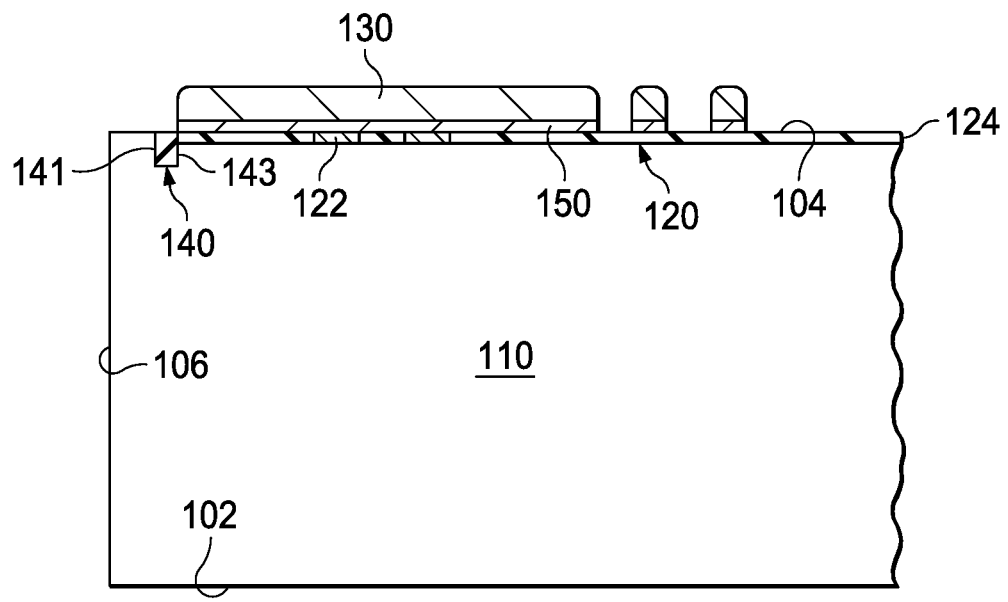
Figure 4H:
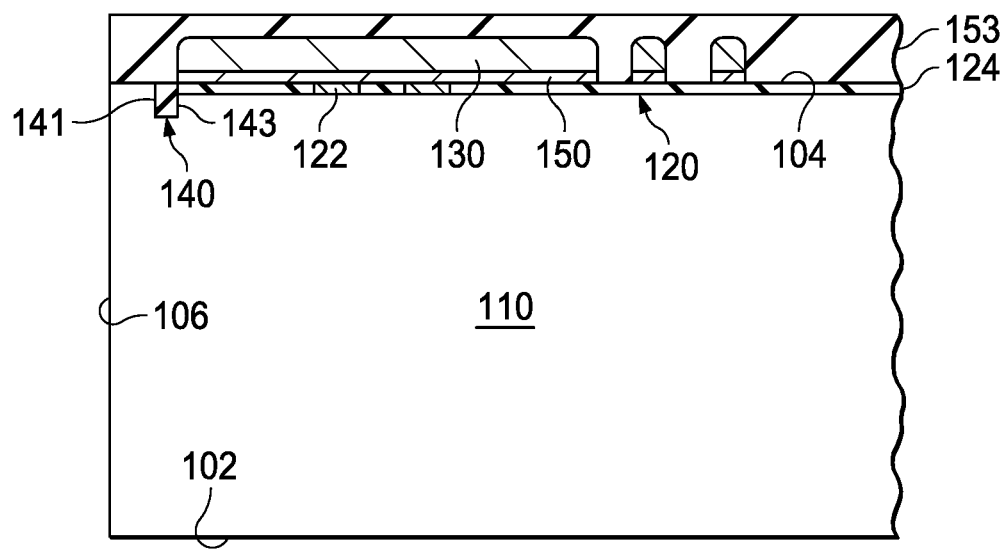
Figure 4I:
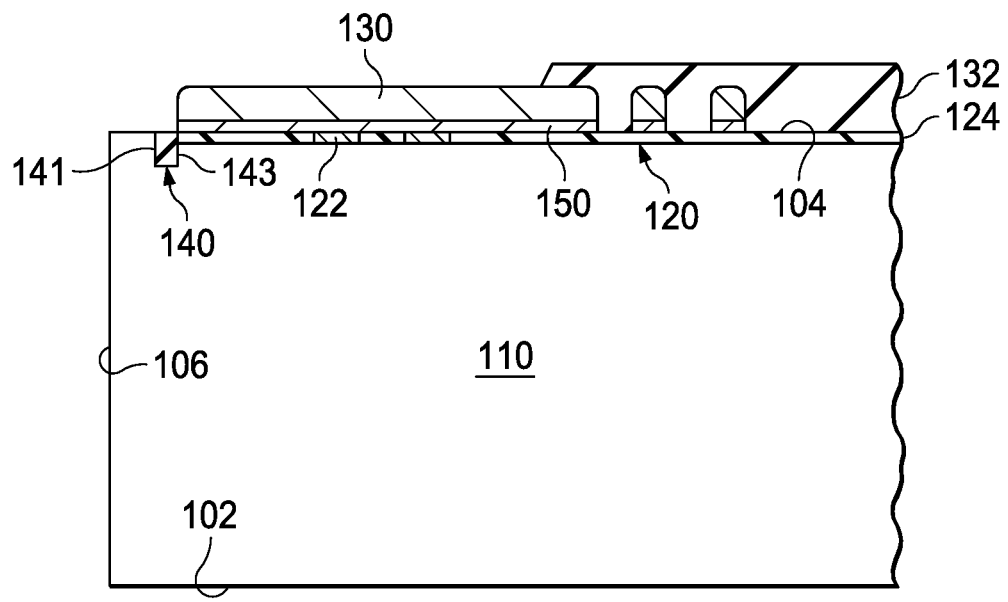
Figure 4J:
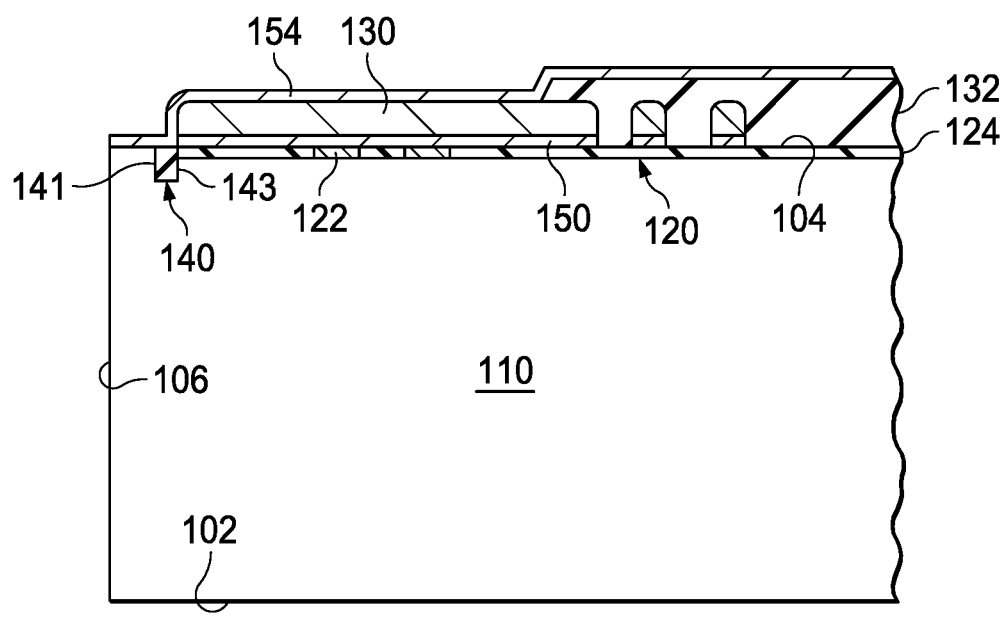
Figure 4K:
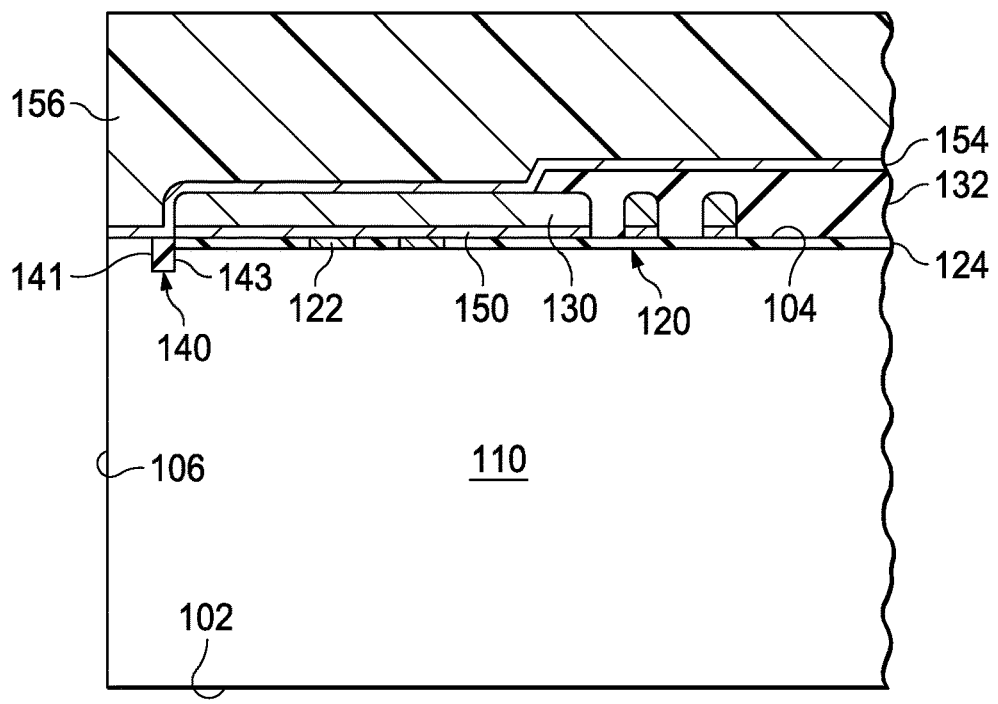
Figure 4L:
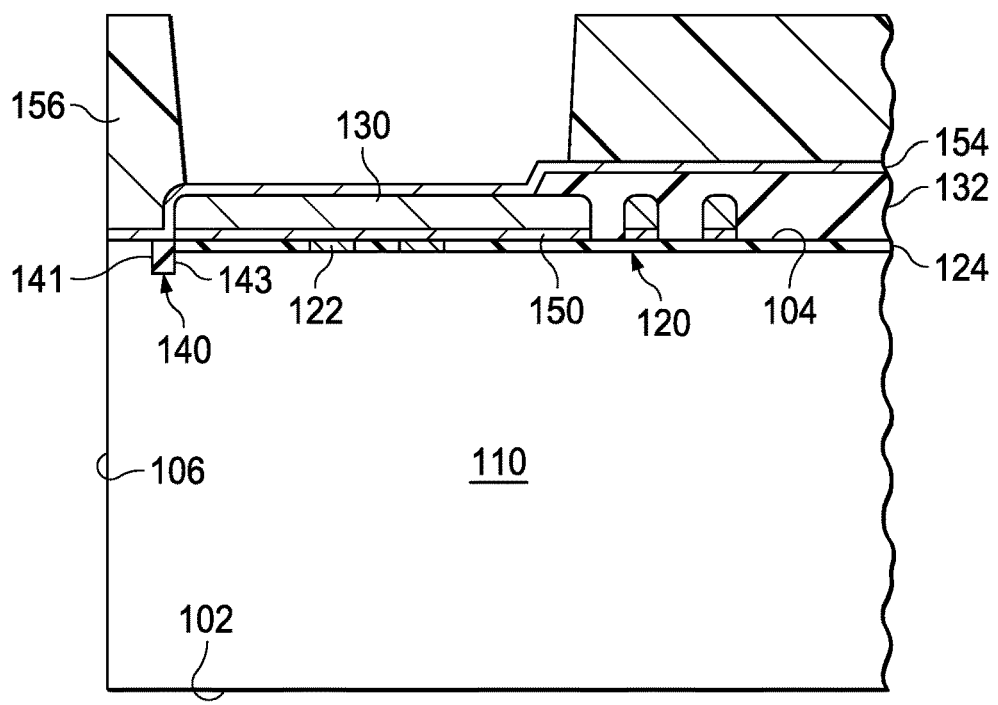
Figure 4M:
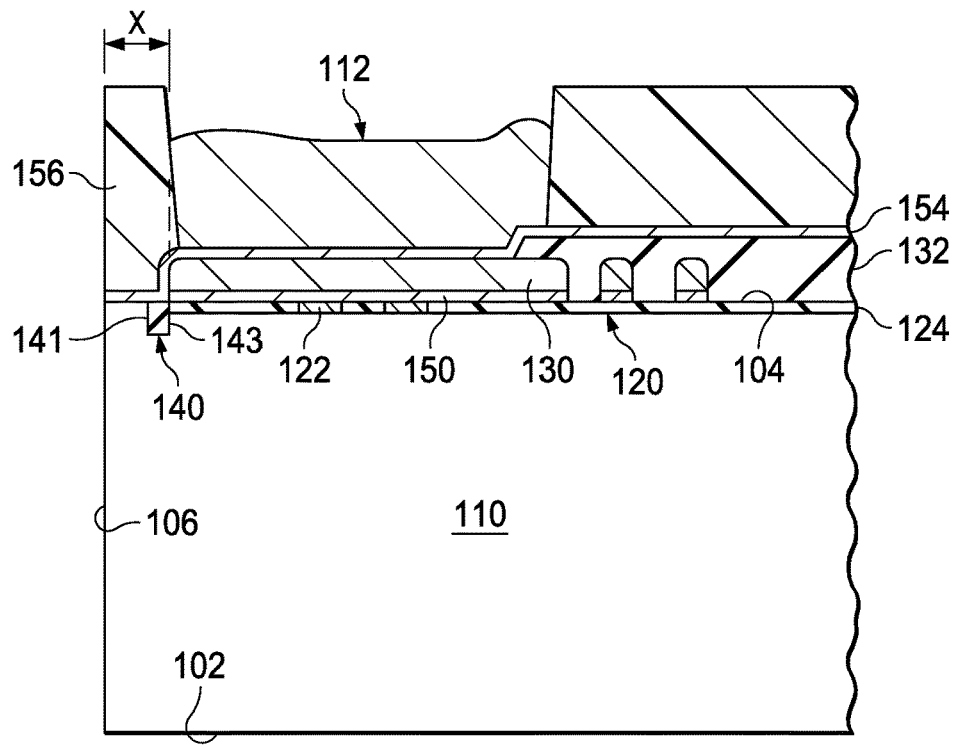
Figure 4N:
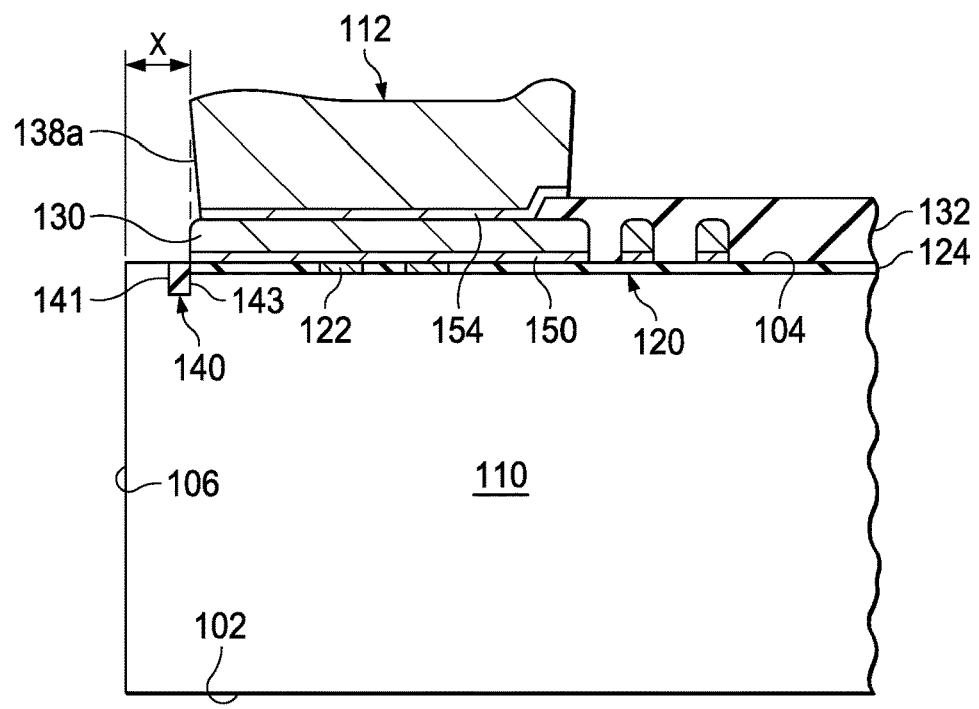
Figure 4O:
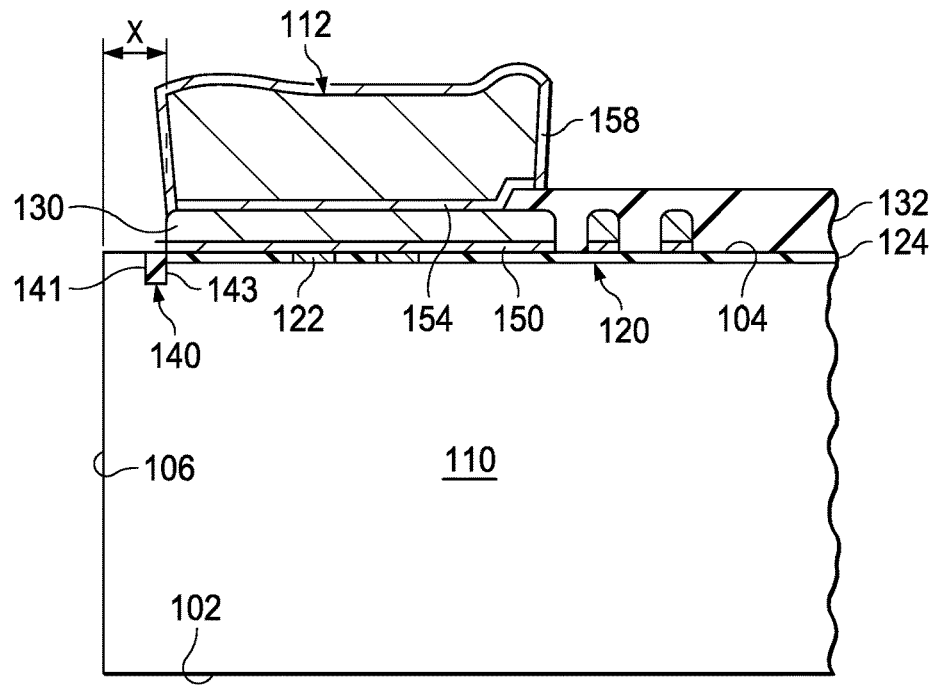
Figure 5:
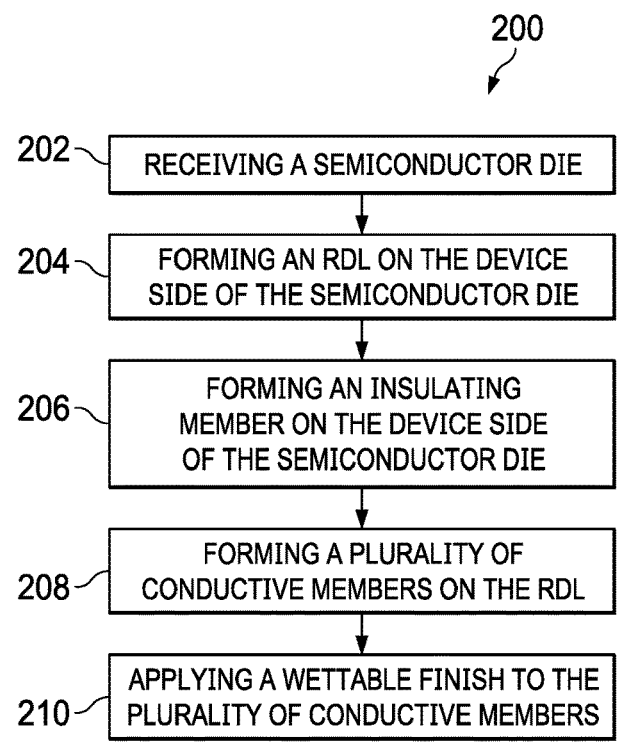
FIG. 5 is a flow diagram of a method for manufacturing a WCSP that may form visually inspectable solder members according to some examples.

FIGS. 4A-4O illustrate a process for manufacturing a WCSP (e.g., WCSP 100) that may form solder fillets (e.g., solder members 114) visible in a top view according to some examples. In addition, FIG. 5 is a flow diagram of a method 200 for manufacturing a WCSP that may form solder fillets visible in a top view according to some examples. Accordingly, FIGS. 4A-4O and 5 are described in parallel.

The manufacturing process of FIGS. 4A-4O and the method 200 of FIG. 5 are carried out on or with a semiconductor wafer such that the resulting semiconductor die package is a WCSP as described above. The depictions in FIGS. 4A-4O and the features of method 200 in FIG. 5 present and describe, respectively, various manufacturing actions related to a single portion of a wafer that will subsequently be singulated from the wafer to produce an individual WCSP so as to simplify the description and figures. However, in practice, these manufacturing actions may be carried out in parallel across a semiconductor wafer so as to simultaneously produce multiple WCSPs in bulk. For ease of description, at least some of the operations depicted in FIGS. 4A-4O and 5 are described below as being performed on a semiconductor die, but the actions are being performed on a portion of (or all of) a wafer that will subsequently be singulated from the wafer to produce a semiconductor die (and, more particularly, a WCSP).

Method 200 begins by receiving a semiconductor die at block 202. As previously described, the semiconductor die received at block 202 may be part of a semiconductor wafer comprising a plurality of similar semiconductor dies that have not yet been singulated. As shown in FIG. 4A, the received semiconductor die 110 may include a circuit 120 formed on a device side 104 thereof, and a plurality of conductive members 122 coupled to circuit 120 and positioned within an insulating member 124 arranged over circuit 120. In addition, the semiconductor die 110 may include a scribe seal 140 circumscribing the circuit 120 along device side 104. The circuit 120 and scribe seal 140 may be as previously described above for WCSP 100 (FIGS. 3A-3C).

Next, method 200 includes forming an RDL on the device side of the semiconductor die at block 204. In some examples, the RDL may be formed at block 204 using a photolithography process.

For instance, as shown in FIG. 4B, a seed layer 150 of conductive material (e.g., Cu, Ti, or alloys thereof) may be applied atop the insulating member 124 and conductive members 122, overtop of scribe seal 140 and circuit 120. In some examples, the seed layer 150 may be applied to insulating member 124 and conducive members 122 of semiconductor die 110 via sputtering or other suitable technique. Next, as shown in FIG. 4C, a layer of photoresist material 152 (e.g., a photopoylmeric material, a photodecomposing material, a photocrosslinking material) may be applied to the seed layer 150. Next, as shown in FIG. 4D, portions of the photoresist material 152 are exposed to ultraviolet (UV) light through a photomask (not shown) so as to chemically alter the photoresist material 152 in these selected portions. Thereafter, a developer solution (e.g., sodium hydroxide, tetramethylammonium hydroxide) may be applied to the photoresist material 152 to remove the photoresist material 152 in the portions that were exposed to the UV light. As a result, the seed layer 150 is exposed in the areas where the photoresist material 152 was removed. Next, as shown in FIG. 4E, conductive material may be grown (e.g., via electrical plating techniques) over the exposed portions of the seed layer 150 to form the RDL 130. As shown in FIG. 4F, after forming the RDL 130, the remaining photoresist material 152 may be removed, thereby leaving the RDL 130 atop seed layer 150. In some examples, the remaining photoresist material 152 may be removed in any suitable manner, such as etching (e.g., chemically or via plasma). Finally, as shown in FIG. 4G, the exposed portions of seed layer 150 that are not covered by RDL 130 are removed via an etching process (e.g., chemically or via plasma).

The portions of the photoresist material 152 that are removed include portions that extend to the scribe seal 140. Thus, when the RDL 130 is formed, portions of the RDL 130 may also extend out to the inner side 143 of scribe seal 140 as previously described.

Method 200 also includes forming the insulating member on the device side of the semiconductor die at block 206. In some examples, as shown in FIG. 4H, a layer of electrically insulating material 153 (e.g., polyimide) is deposited over the top of the device side 104 of semiconductor die 110 so that the RDL 130, scribe seal 140, and circuit 120 are covered by the insulating material 153. Thereafter, as shown in FIG. 4I, select portions of the insulating material 153 may be removed via a similar UV light exposure and development process as described above for the photoresist material 152 in FIG. 4D. As a result, select portions of the RDL 130 are exposed in the areas where the insulating material 153 was selectively removed, and the remaining portions of the insulating material 153 may form the insulating member 132.

Method 200 also includes forming a plurality of conductive members on the RDL at block 208. For instance, as shown in FIGS. 4J-4N, the conductive members 112 may be formed atop the portions of the RDL 130 that are exposed through the insulating member 132. In some examples, the conductive members 112 may be formed using a photolithography process similar to the process previously described above for forming the RDL 130 (e.g., for block 206 and shown in FIGS. 4B-4G).

Specifically, as shown in FIG. 4J, a seed layer 154 may be applied atop the device side 104 of semiconductor die 110, over the seed layer 150 and RDL 130. The seed layer 154 may be similar to the seed layer 150 (FIG. 4B) and may be applied in a similar manner. Next, as shown in FIGS. 4K and 4L, a photoresist material 156 may be applied over the seed layer 154 (FIG. 4K) and then selective portions of the photoresist material 156 may be removed (FIG. 4L) in a similar manner to that described above for photoresist material 152 shown in FIGS. 4E and 4F. Next, a conductive material may be formed (e.g., via an electric plating process) in the areas where the photoresist material 156 was removed to thereby form the conductive member 112 as shown in FIG. 4M. Finally, as shown in FIG. 4N, the remaining photoresist material 156 may be removed in a similar manner to that described above for photoresist material 152 in FIG. 4F, and the exposed portions of the seed layer 154 that are not positioned under the conductive members 112 may be removed in a similar manner to that described above for seed layer 150 in FIG. 4G.

As previously described, the conductive members 112 may be formed on portions of the RDL 130 so that the conductive members 112 are arranged within a relatively close distance (e.g., distance X in FIGS. 3A and 3C, previously described above) to the side surface 106 of semiconductor die 110. As previously described, by maintaining the conductive members 112 within a close distance to the side surfaces 106, a solder member 114 connecting the conductive members 112 with a suitable trace on a PCB (e.g., trace 14 shown in FIG. 3A) may extend beyond the side surfaces 106 so as to allow for visible inspection of the solder members 114.

Method 200 also includes applying a wettable finish to the plurality of conductive members at block 210. Specifically, the wettable finish 158 may be positioned on the outer end 136, and the plurality of side surfaces 138 (including the edge-facing side surface 138*a*) (FIG. 3A). The wettable finish 158 may comprise any suitable material that is configured to prevent oxidation of the conductive member 112. In addition, the wettable finish 158 may encourage wetting of solder material (e.g., solder member 114) during operations so as to encourage the formation of a visible fillet of solder member 114 as previously described. In some examples, the wettable finish 158 may comprise tin (Sn), electroless nickel immersion gold (ENIG), electroless nickel, immersion palladium, immersion gold (ENIPIG), etc. Thus, in some examples, the wettable finish 158 may be applied via an immersion deposition.

In some examples, the semiconductor dies 110 of the wafer (not shown) may be singulated after forming the conductive members 112 (or after applying the wettable finish 158). In particular, singulation may involve cutting along so-called scribe streets formed between the scribe seals 140 of adjacent semiconductor dies along the wafer. In some examples, singulation may be carried out with a mechanical saw, or a laser. The distance between the side surfaces 106 of semiconductor die 110 and scribe seal 140 (which provides the distance X between side surfaces 106 and edge-facing side surfaces 138*a* of conductive members 112 as previously described) may provide sufficient offset to avoid direct interaction between the cutting device used for singulation and the scribe seal 140, circuit 120, conductive member 112, RDL 130, etc. In some examples, use of a laser for simulating the WCSP 100 from the wafer may provide a smaller cutting width, so that the distance X may be reduced (e.g., to or toward 10 μm), thus further ensuring that the fillers formed by solder member 114 may be visible when WCSP 100 is viewed from above (e.g., FIG. 3C).

Figure 6A:
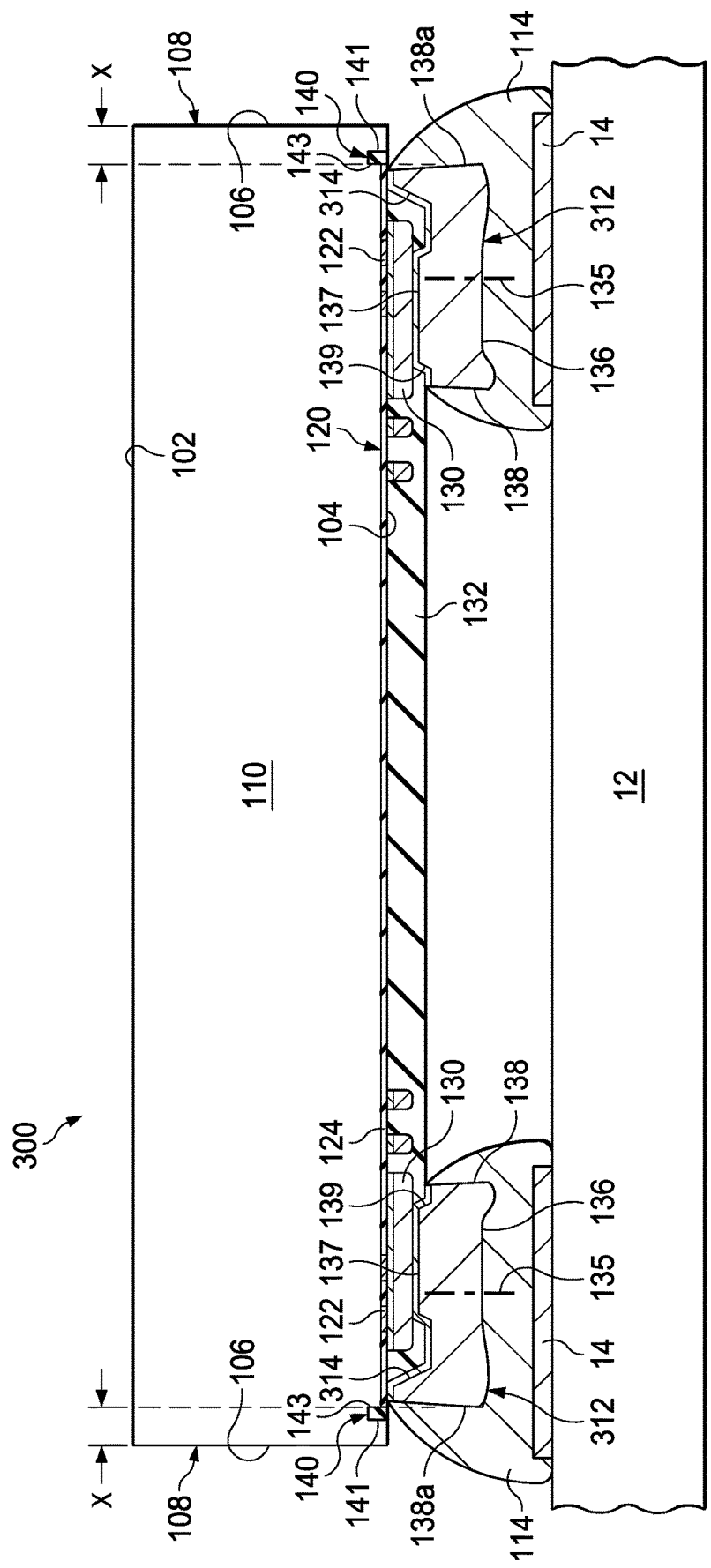
FIG. 6A is a cross-sectional view of a WCSP for use within the electronic device of FIG. 1 according to some examples.

Referring now to FIG. 6A, a cross-sectional view of an example of the WCSP 100 in FIG. 2 along section 3A-3A is shown according to some examples. For clarity, the WCSP shown in FIG. 6A may be designated with the reference numeral 300. However, in certain aspects, the WCSP 300 may be similar to the WCSP 100 previously described and shown in FIGS. 3A-3C. As a result, the same reference numerals are used to designate components of WCSP 300 that are shared with WCSP 100 and the discussion below will focus on the features of WCSP 300 that are different from WCSP 100, previously described.

In particular, as shown in FIG. 6A, the conductive members 312 of the WCSP 300 may include the outer end 136 and side surfaces 138 (including the edge-facing side surface 138*a*) as previously described. However, for WCSP 300, the RDL 130 may not extend out to abut and/or align with the inner side 143 of scribe seal 140. Rather, the edge-facing side surface 138*a* of each conductive member 312 may instead extend outward beyond the RDL to directly abut and/or align with the inner side 143 of scribe seal 140. As a result, the edge-facing side surface 138*a* may be spaced from the side surface 106 of semiconductor die 110 by the distance X as previously described. Accordingly, the proximity of the edge-facing side surface 138*a* may allow the solder member 114 to form a fillet that extends from the edge-facing side surface 138*a* beyond the side surface 106 of semiconductor die 110 as previously described.

In addition, a recess 314 may be formed in the conductive members 312 that extends axially (e.g., with respect to the corresponding axis 135) into inner end 137. The recess 314 may be filled (or substantially filled) with the insulating material 153 of insulating member 132 of RDL 130. Moreover, the recess 314 may be shaped and arranged such that the portion of insulating material 153 (of insulating member 132) contained therein overlaps with a portion of the conductive member 312 so as to dissipate stresses transferred between the conductive members 312 and RDL 130 during operations as previously described. The recess 314 may extend a distance along the RDL 130 within a similar range as described above for the depth of recess 139 along side surfaces 138. Thus, the conductive members 312 may comprise both the recess 314 (which may be referred to as a "first recess") and the recess 139 (previously described, and which may be referred to as a "second recess").

Figure 6B:
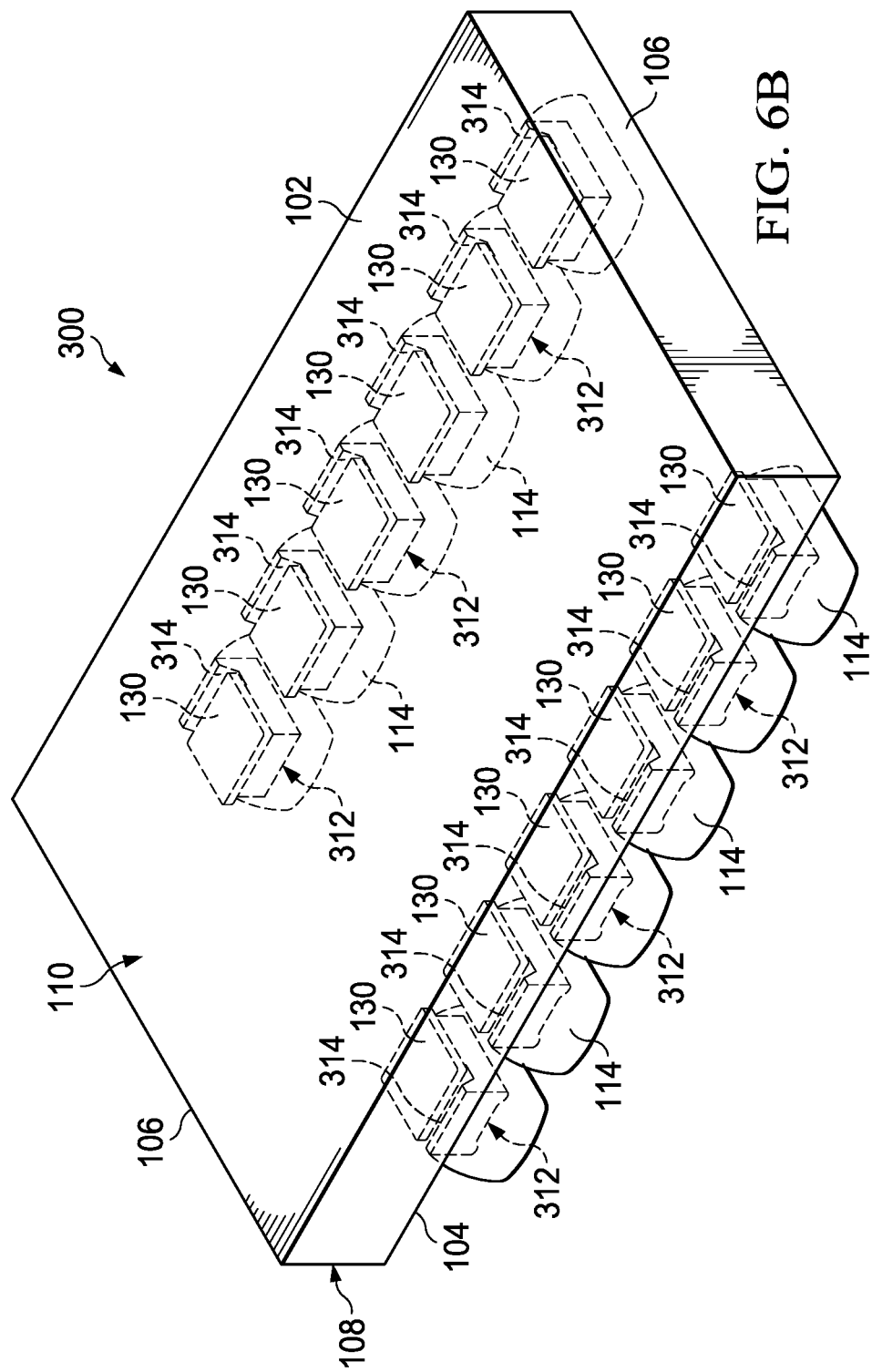
FIG. 6B is a perspective view of the WCSP shown in FIG. 6A without the PCB according to some examples.
Figure 6C:
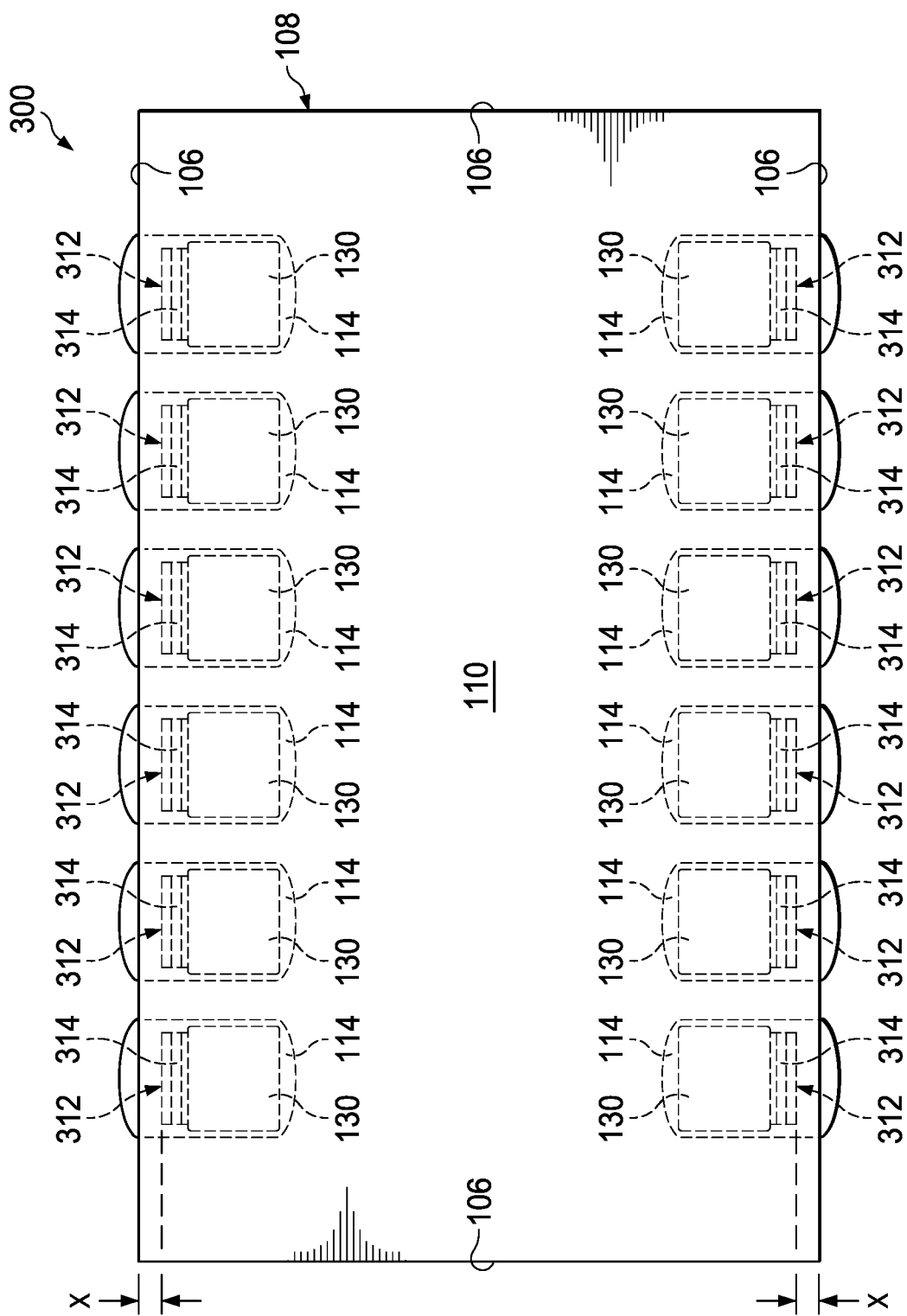
FIG. 6C is a top view of the WCSP and PCB shown in FIG. 6A according to some examples.

FIG. 6B shows a perspective view of the WCSP 300 of FIG. 6A without the PCB 12. In addition, FIG. 6C shows a top-down view of the WCSP 300 of FIG. 6A, further illustrating how the solder members 114 extend beyond the side surfaces 106 of semiconductor die 110 as previously described.

Figure 7A:
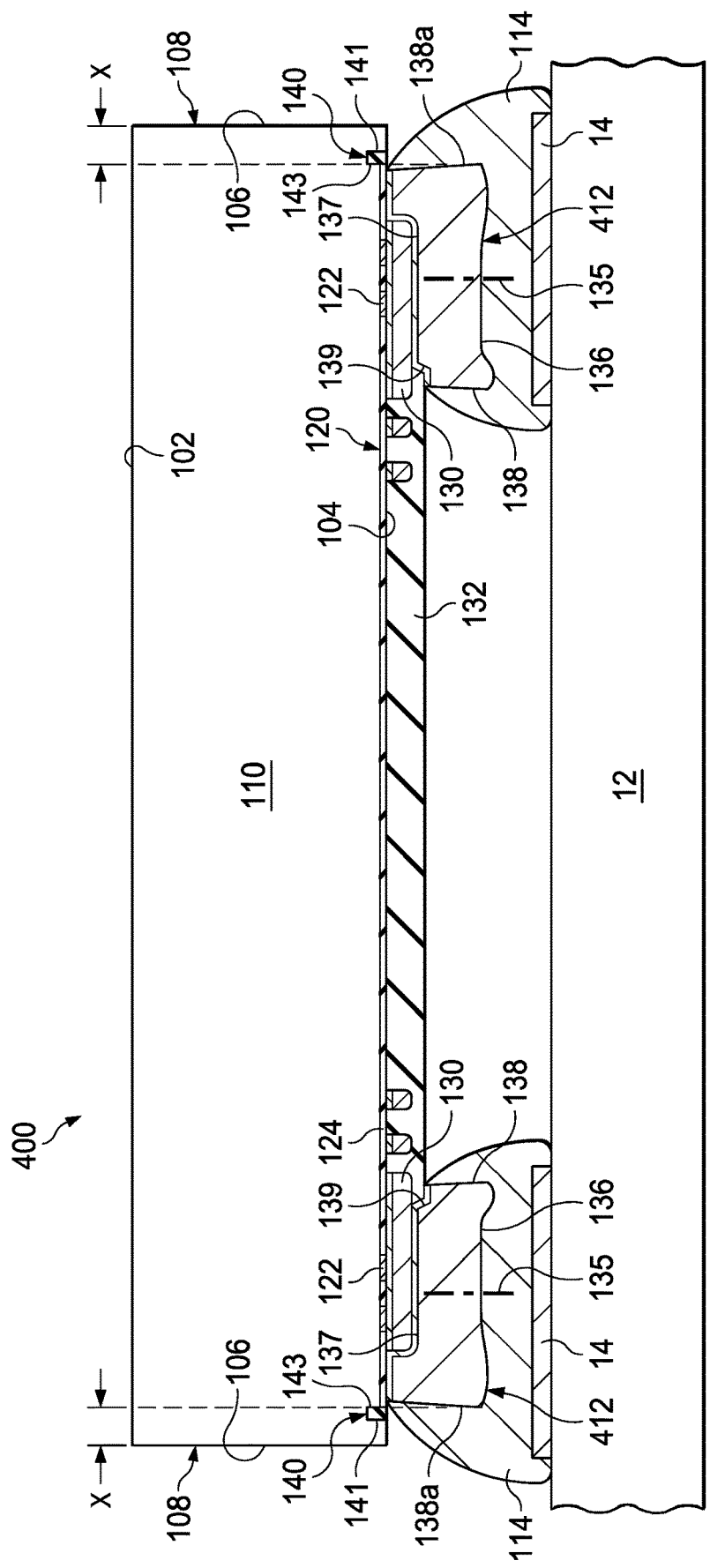
FIG. 7A is a cross-sectional view of a WCSP for use within the electronic device of FIG. 1 according to some examples.

Referring now to FIG. 7A, a cross-sectional view of an example of the WCSP 100 in FIG. 2 along section 3A-3A is shown according to some examples. For clarity, the WCSP shown in FIG. 7A may be designated with the reference numeral 400. However, in certain aspects, the WCSP 400 may be similar to the WCSP 300 previously described and shown in FIGS. 6A-6C. As a result, the same reference numerals are used to designate components of WCSP 400 that are shared with WCSP 300 and the discussion below will focus on the features of WCSP 400 that are different from WCSP 300, previously described.

Figure 7C:
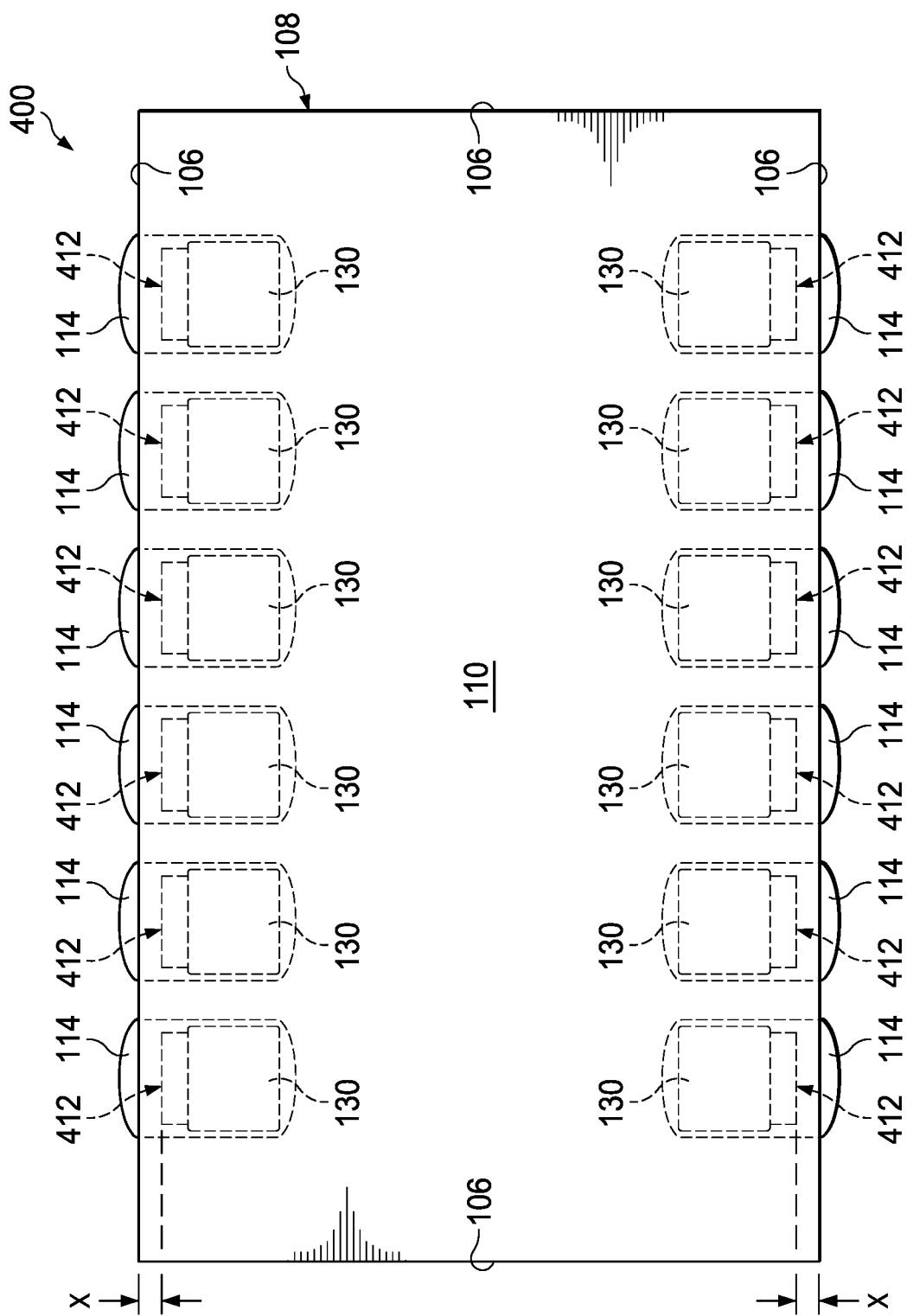
FIG. 7C is a top view of the WCSP and PCB shown in FIG. 7A according to some examples.

In particular, as shown in FIG. 7A, the WCSP 400 may include a plurality of conductive members 412 that are generally the same as the conductive members 312 (FIG. 6A), except that no recess 314 is included along inner end 137. FIG. 7B shows a perspective view of the WCSP 400 of FIG. 7A without the PCB 12. In addition, FIG. 7C shows a top-down view of the WCSP 400 of FIG. 7A, further illustrating how the solder members 114 extend beyond the side surfaces 106 of semiconductor die 110 as previously described.

Figure 8A:
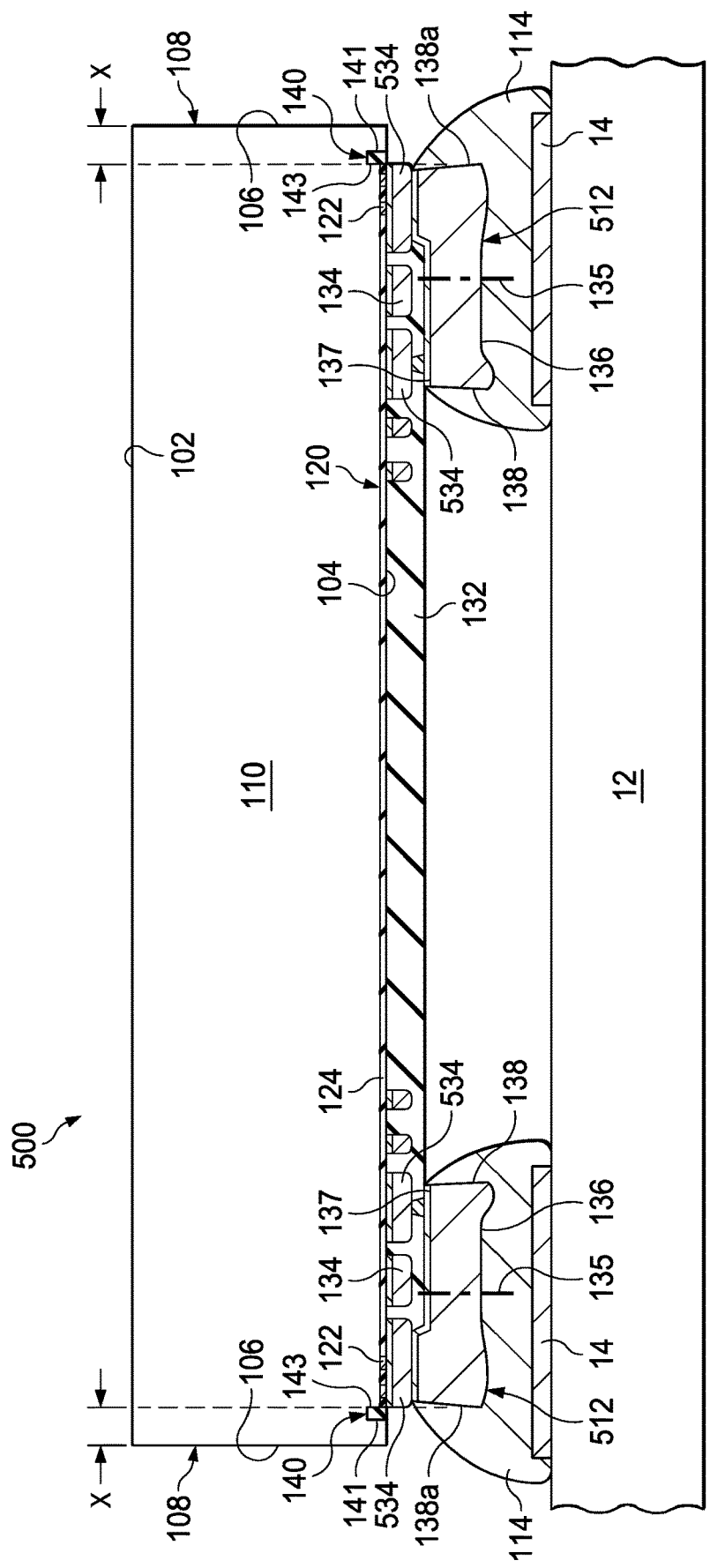
FIG. 8A is a cross-sectional view of a WCSP for use within the electronic device of FIG. 1 according to some examples.

Referring now to FIG. 8A, a cross-sectional view of the WCSP 100 in FIG. 2 along section 3A-3A is shown according to some examples. For clarity, the WCSP shown in FIG. 8A may be designated with the reference numeral 500. However, in certain aspects, the WCSP 500 may be similar to the WCSP 100 previously described and shown in FIGS. 3A-3C. As a result, the same reference numerals are used to designate components of WCSP 500 that are shared with WCSP 100 and the discussion below will focus on the features of WCSP 500 that are different from WCSP 100, previously described.

In particular, as shown in FIG. 8A, the WCSP 500 may include a plurality of conductive members 512 that include an outer end 136 and side surfaces 138 (including the edge-facing side surface 138a) as previously described. However, for WCSP 500, a so-called "selective PI" pattern is used for the RDL 130 such that select partial redistribution portions 534 of the RDL 130 may be engaged with conductive members 512, while the remaining portions of the RDL 130 are electrically insulated from conductive members 512 via insulating member 132. As a result, electric current conducted through conductive members 512 may be more selectively routed within and through the RDL 130.

Figure 8B:
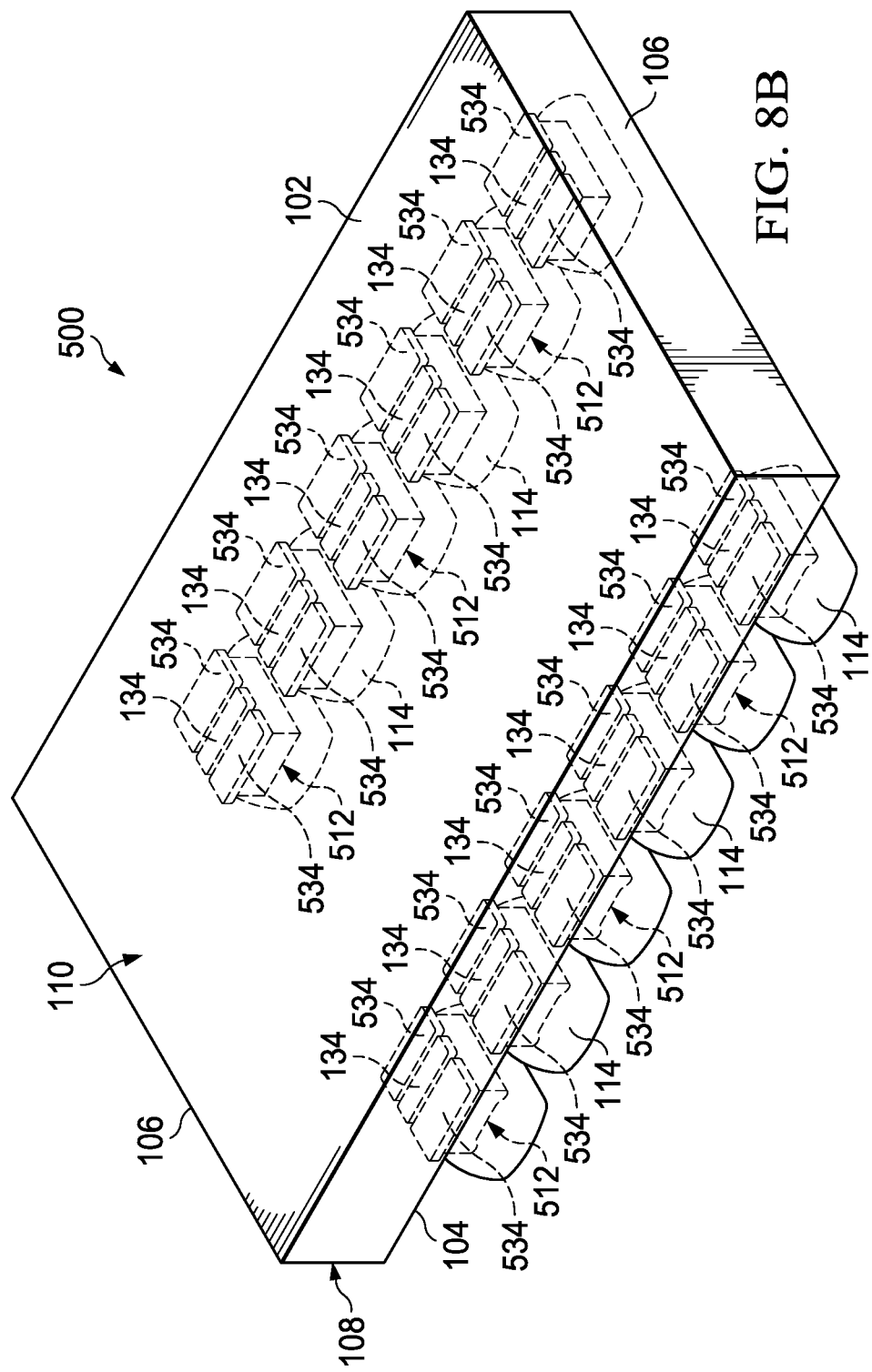
FIG. 8B is a perspective view of the WCSP shown in FIG. 8A without the PCB according to some examples.
Figure 8C:
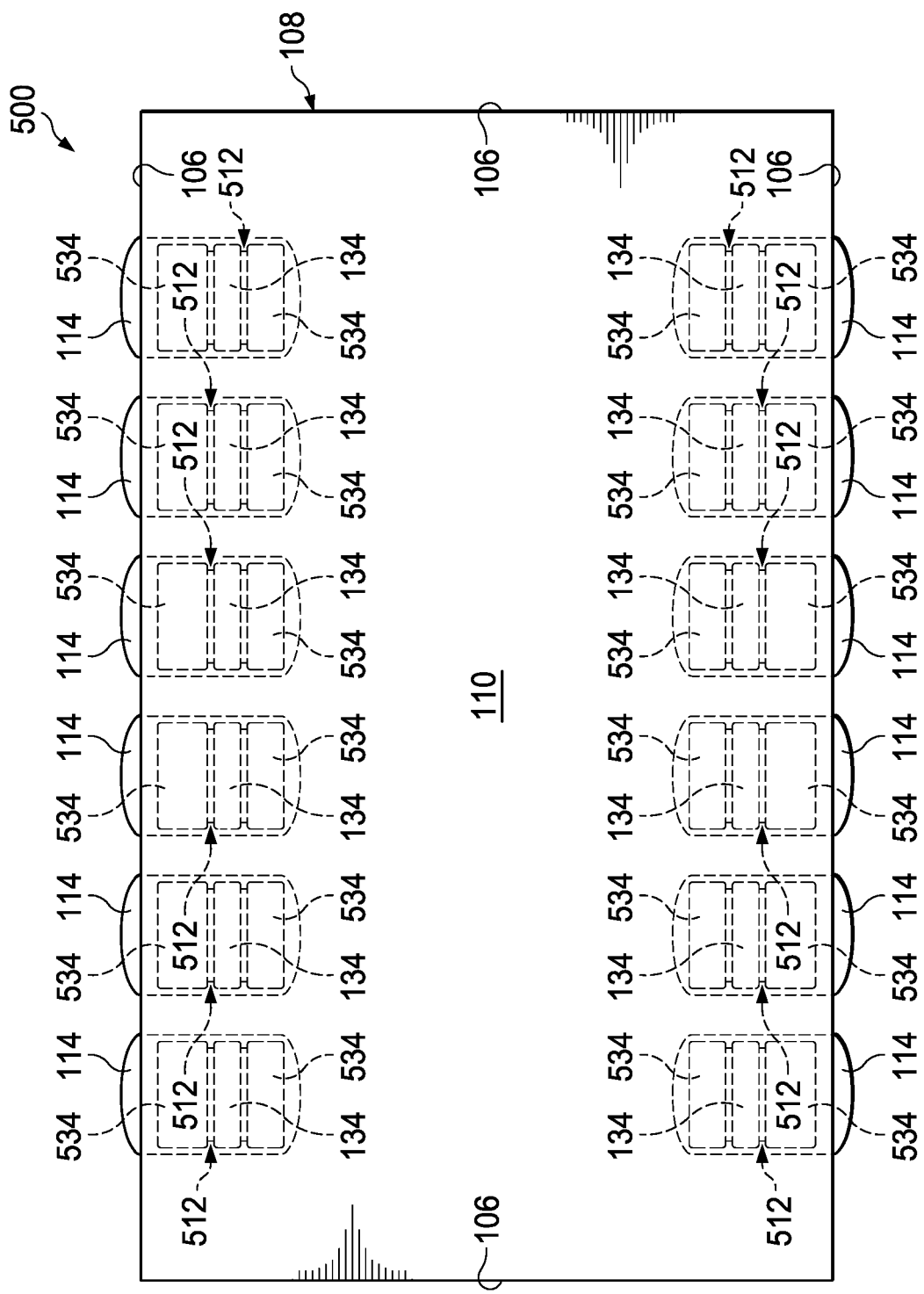
FIG. 8C is a top view of the WCSP and PCB shown in FIG. 8A according to some examples.

FIG. 8B shows a perspective view of the WCSP 500 of FIG. 8A without the PCB 12. In addition, FIG. 8C shows a top-down view of the WCSP 500 of FIG. 8A, further illustrating how the solder members 114 extend beyond the side surfaces 106 of semiconductor die 110 as previously described.

Figure 9A:
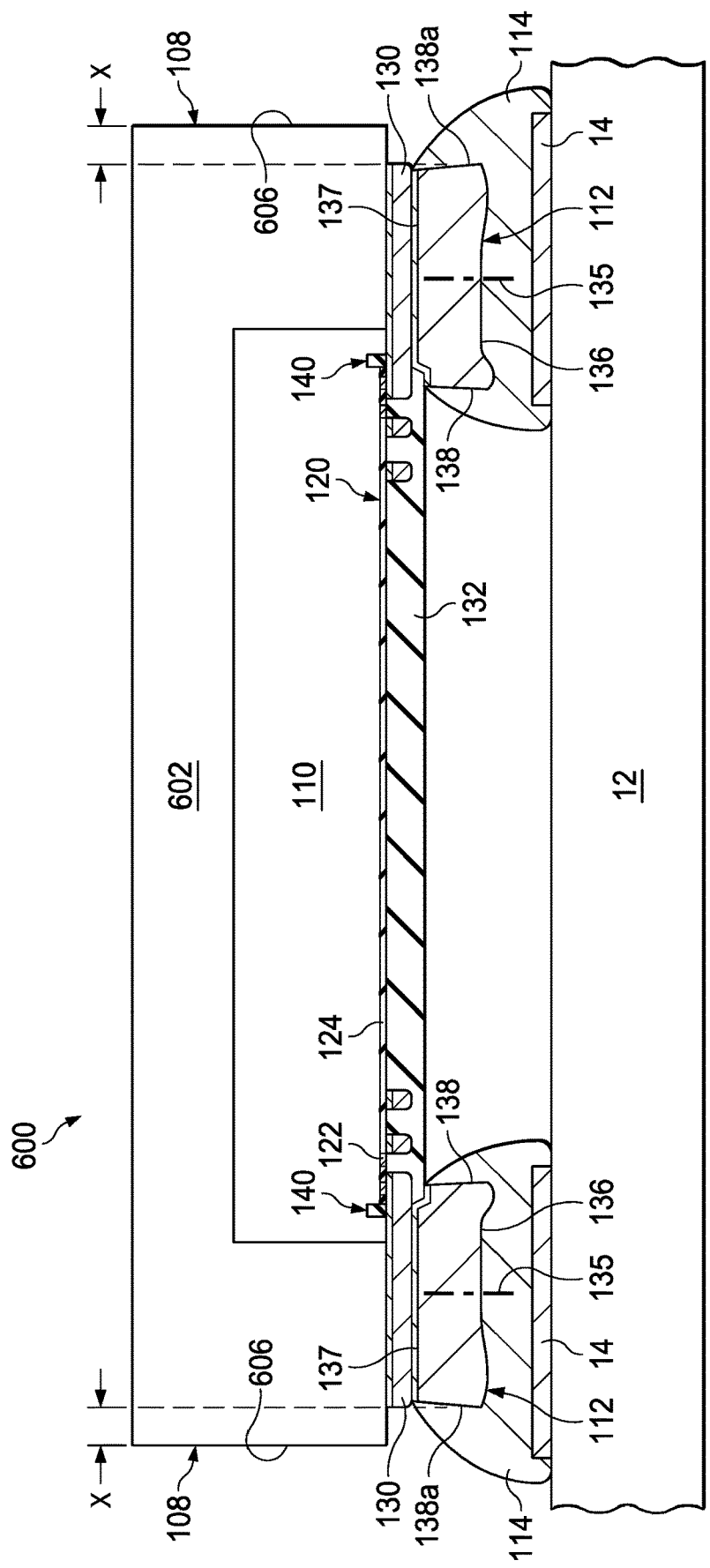
FIG. 9A is a cross-sectional view of a WCSP for use within the electronic device of FIG. 1 according to some examples.

Referring now to FIG. 9A, a cross-sectional view of the WCSP 100 in FIG. 2 along section 3A-3A is shown according to some examples. For clarity, the WCSP shown in FIG. 9A may be designated with the reference numeral 600. However, in certain aspects, the WCSP 600 may be similar to the WCSP 100 previously described and shown in FIGS. 3A-3C. As a result, the same reference numerals are used to designate components of the WCSP 600 that are shared with the WCSP 100 and the discussion below will focus on the features of WCSP 600 that are different from WCSP 100, previously described.

In particular, as shown in FIG. 9A, the WCSP 600 may comprise a so-called "fan-out" WCSP whereby the semiconductor wafer is packaged within an additional substrate 602 which may comprise a mold compound or other material (e.g., inactive silicon or copper). Accordingly, the RDL 130 may extend beyond the side surface 106 of the semiconductor die 110 onto the substrate 602 (e.g., beyond scribe seal 140), and the conductive members 112 may be substantially arranged outside of the semiconductor die 110 (e.g., beyond side surfaces 106). The substrate 602 may comprise a plurality of side surfaces 606 that form the outer perimeter 108 of WCSP 600 (rather than the side surface 106 of semiconductor die 110). As can be seen in at least FIG. 9A, the edge-facing side surface 138a of conductive members 112 may be within the distance X from a corresponding side surface 606 of substrate 602 so that solder member 114 may extend from edge-facing side surface 138a beyond the corresponding side surface 606 when the WCSP 600 is coupled to a PCB 12 as previously described.

Figure 9B:
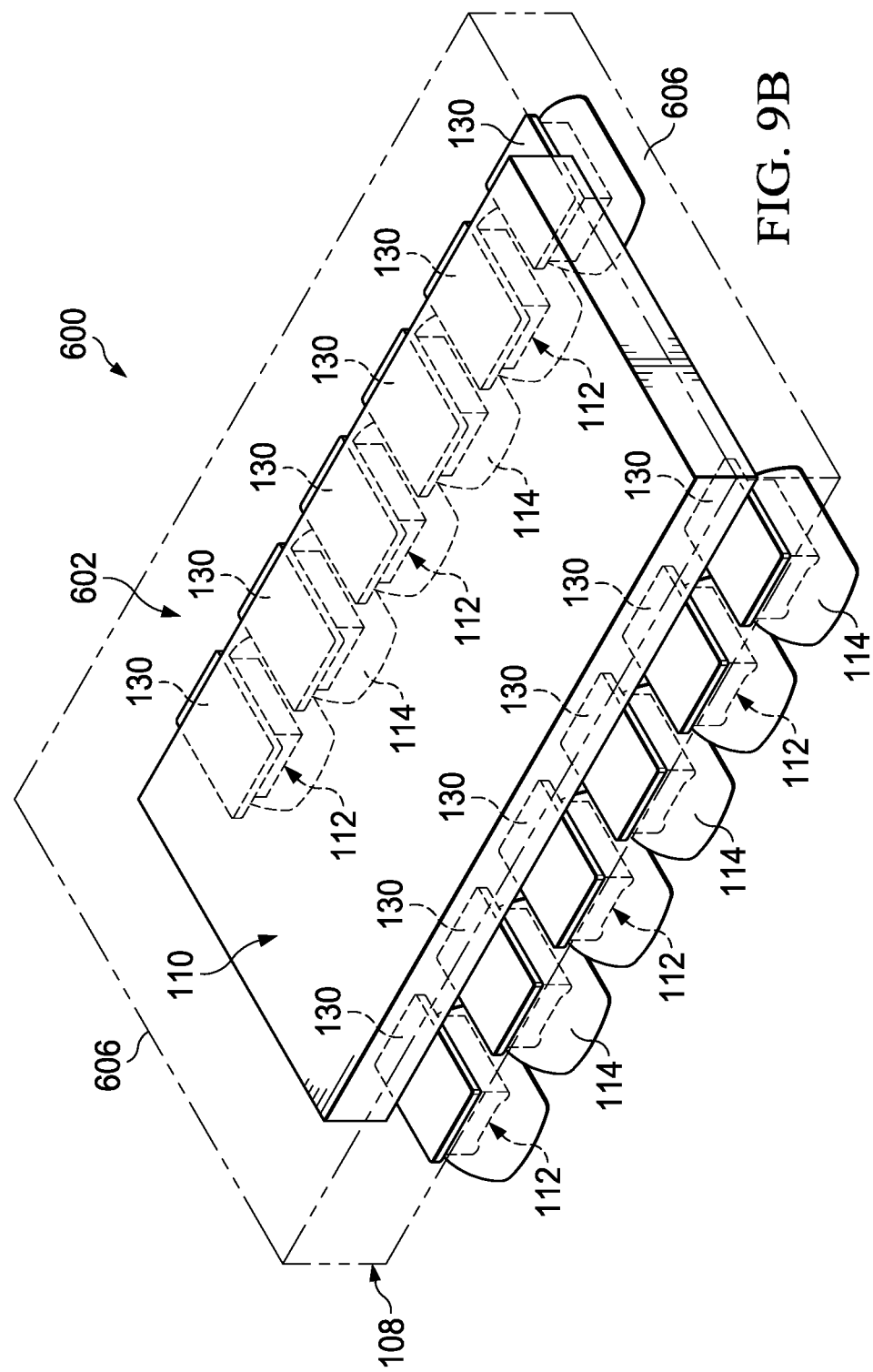
FIG. 9B is a perspective view of the WCSP shown in FIG. 9A without the PCB according to some examples.
Figure 9C:
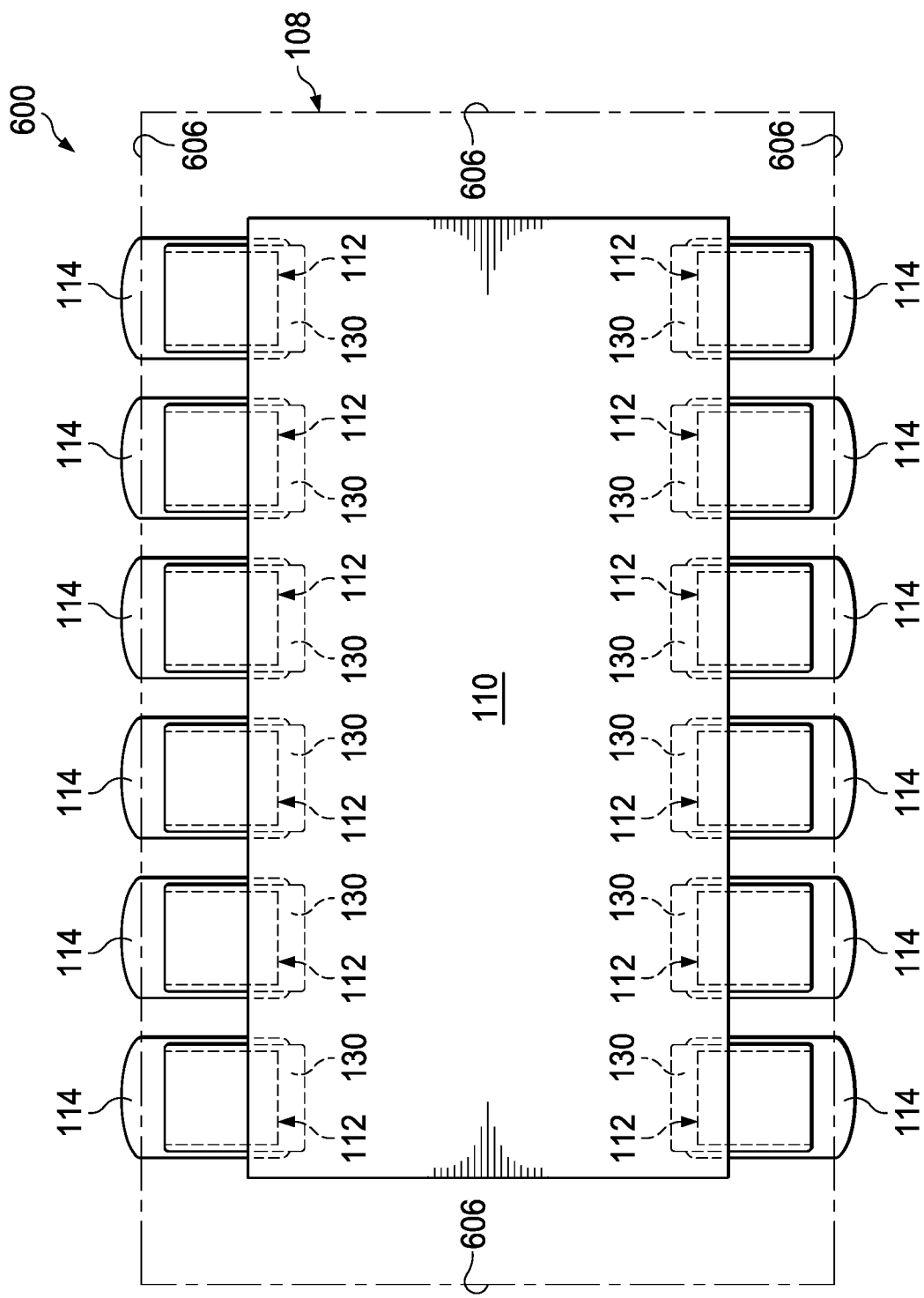
FIG. 9C is a top view of the WCSP and PCB shown in FIG. 9A according to some examples.

FIG. 9B shows a perspective view of the WCSP 600 of FIG. 9A without the PCB 12. In addition, FIG. 9C shows a top-down view of the WCSP 600 of FIG. 9A, further illustrating how the solder members 114 extend beyond the side surfaces 606 of substrate 602 as previously described. It should be appreciated that arrangements of the conductive members (e.g., 112, 312, 412, 512) and RDL 130 described for the various examples disclosed herein may be applied to the fan-out WCSP 600.

For the WCSPs 300, 400, 500, 600 shown in FIGS. 6A-9C, the alternative shapes and arrangements of the conductive members (e.g., conductive members 112, 312, 412, 512) and RDL 130 may be accomplished by adjusting the shape and positioning of the photomask(s) utilized during the photolithography processes utilized in the manufacturing method described above (e.g., FIGS. 4A-4O).

The examples disclosed herein include WCSPs that are arranged and designed such that the conductive members may be positioned within a sufficient proximity to the side surfaces of the chip package to form visible (e.g., from above) solder members (or solder fillets) when connected to a PCB (or other suitable component). As a result, the WCSPs of the examples disclosed herein may be subjected to visual solder connection inspection techniques, such as manual inspection or AVI. However, the WCSPs of the examples disclosed herein may still be manufactured using WLP techniques as previously described. Thus, through use of the WCSPs of the examples disclosed herein, WCSPs may be utilized in a wider variety of electronic devices, so that the economic benefits of these semiconductor packages may be more broadly realized.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrases "ground voltage potential," "grounded," "ground," or the like in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

In addition, as used herein, the terms "axial" and "axially" generally mean along or parallel to a given axis (e.g., central axis of a body or a port), while the terms "radial" and "radially" generally mean perpendicular to the given axis. For instance, an axial distance refers to a distance measured along or parallel to the axis, and a radial distance refers to a distance measured perpendicular to the axis.

What is claimed is:

1. A wafer chip scale package (WCSP), comprising:
   a semiconductor die having a device side in which a circuit is formed;
   a redistribution layer (RDL) coupled to the device side that is positioned within an insulating member;
   a scribe seal circumscribing the circuit along the device side, wherein the RDL abuts the scribe seal; and
   a conductive member coupled to the RDL, wherein the conductive member is configured to receive a solder member, and wherein the insulating member is absent on the device side of the semiconductor die between the conductive member and a portion of an outer perimeter of the WCSP closest to the conductive member.

2. The WCSP of claim 1, wherein a first side surface of the conductive member is positioned less than or equal to 30 micrometers (μm) from the outer perimeter.

3. The WCSP of claim 2, wherein the first side surface is positioned less than or equal to 30 μm and at least 10 μm from the outer perimeter.

4. The WCSP of claim 1, wherein the conductive member comprises:
   a central axis;
   an inner end engaged with the RDL;
   an outer end spaced from the inner end along the central axis;
   wherein the first side surface extends between the inner end and the outer end;
   a second side surface extending between the inner end and the outer end; and
   a recess extending radially inward toward the central axis along the second side surface.

5. The WCSP of claim 4, wherein the recess does not extend along the first side surface, and wherein the insulating member extends within the recess.

6. The WCSP of claim 5, comprising a solder wettable finish positioned on the first side surface, the second side surface, wherein the solder wettable finish is configured to prevent oxidation of the conductive member.

7. The WCSP of claim 6, wherein the wettable finish comprises tin (Sn), electroless nickel immersion gold (ENIG), electroless nickel, immersion palladium, or immersion gold (ENIPIG).

8. The WCSP of claim 1, wherein the semiconductor die comprises a plurality of side surfaces that define the outer perimeter.

9. The WCSP of claim 1, comprising a substrate, wherein the semiconductor die is positioned within the substrate, and wherein the substrate comprises a plurality of side surfaces that define the outer perimeter.

10. A wafer chip scale package (WCSP), comprising:
    a semiconductor die having a device side in which a circuit is formed;
    a redistribution layer (RDL) coupled to the device side; and
    a conductive member coupled to the RDL and to the device side of the semiconductor die, a segment of the device side between the conductive member and a portion of an outer perimeter of the WCSP closest to the conductive member being independent of a polyimide (PI) layer, wherein when the WCSP is coupled to a printed circuit board (PCB), the conductive member is configured to form a solder fillet that extends from the conductive member beyond the outer perimeter of the WCSP;

wherein the conductive member comprises:
a central axis;
an inner end engaged with the RDL; and
a first recess extending axially into the inner end with respect to the central axis.

11. The WCSP of claim 10, wherein the conductive member comprises:
an outer end spaced from the inner end along the central axis; and
a plurality of side surfaces extending between the inner end and the outer end along the central axis.

12. The WCSP of claim 11, comprising a scribe seal circumscribing the circuit along the device side, wherein a first side surface of the plurality of side surfaces is aligned with the scribe seal.

13. The WCSP of claim 12, wherein the conductive member comprises a second recess extending radially inward toward the central axis along all of the plurality of side surfaces except for the first side surface, wherein the RDL is positioned within an insulating member, and wherein the insulating member extends within the first recess and the second recess.

14. The WCSP of claim 10, wherein the conductive member is spaced less than 30 micrometers (μm) from the outer perimeter of the WCSP.

15. The WCSP of claim 14, wherein the conductive member is spaced less than 30 μm and at least 10 μm from the outer perimeter of the WCSP.

16. The WCSP of claim 15, wherein a plurality of side surfaces of the semiconductor die form the outer perimeter of the WCSP, the plurality of side surfaces of the semiconductor die extending in a direction orthogonal to the device side of the semiconductor die.

17. A wafer chip scale package (WCSP), comprising:
a semiconductor die having a device side comprising a scribe seal;
a redistribution layer (RDL) coupled to the device side; and
a conductive member coupled to the RDL, wherein the conductive member is configured to receive a solder member,
wherein a first side surface of the conductive member extends beyond the RDL to align with the scribe seal, and wherein a portion of the device side between the conductive member and a portion of an outer perimeter of the WCSP closest to the conductive member is independent of a polyimide (PI) layer.

18. The WCSP of claim 17, wherein the semiconductor die has a circuit formed in the device side, wherein the scribe seal circumscribes the circuit on the device side.

19. The WCSP of claim 18, wherein the scribe seal is spaced less than 25 μm from the outer perimeter of the WCSP.

20. The WCSP of claim 19, wherein the scribe seal is spaced less than 25 μm and at least 10 μm from the outer perimeter of the WCSP.

21. The WCSP of claim 17, wherein the conductive member comprises:
a central axis;
an inner end engaged with the RDL;
an outer end spaced from the inner end along the central axis;
a plurality of side surfaces extending between the inner end and the outer end along the central axis, wherein the first side surface is one of the plurality of side surfaces; and
a recess extending radially inward toward the central axis along all of the plurality of side surfaces except for the first side surface.

22. The WCSP of claim 21, wherein the RDL is positioned within the PI layer, and wherein the PI layer extends within the recess.

* * * * *